US 11,837,535 B2

(12) United States Patent
Huang et al.

(10) Patent No.: US 11,837,535 B2
(45) Date of Patent: Dec. 5, 2023

(54) SEMICONDUCTOR DEVICES INCLUDING DECOUPLING CAPACITORS

(71) Applicant: Taiwan Semiconductor Manufacturing Co., Ltd., Hsinchu (TW)

(72) Inventors: Yu-Xuan Huang, Hsinchu (TW); Hou-Yu Chen, Zhubei (TW); Ching-Wei Tsai, Hsinchu (TW); Kuan-Lun Cheng, Hsinchu (TW); Chung-Hui Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/812,887

(22) Filed: Jul. 15, 2022

(65) Prior Publication Data
US 2022/0359375 A1 Nov. 10, 2022

Related U.S. Application Data

(62) Division of application No. 17/004,768, filed on Aug. 27, 2020, now Pat. No. 11,450,600.
(Continued)

(51) Int. Cl.
*H01L 23/522* (2006.01)
*H01L 21/84* (2006.01)
(Continued)

(52) U.S. Cl.
CPC ........ *H01L 23/5223* (2013.01); *H01L 21/845* (2013.01); *H01L 23/5286* (2013.01);
(Continued)

(58) Field of Classification Search
CPC ............... H01L 23/5223; H01L 21/845; H01L 23/5286; H01L 23/5329; H01L 27/1211;
(Continued)

(56) References Cited

U.S. PATENT DOCUMENTS 9,196,540 B2   11/2015   Chen
9,209,247 B2   12/2015   Colinge et al.
(Continued)

FOREIGN PATENT DOCUMENTS

CN   103247678 A    8/2013
DE   102004052388 A1   5/2006
(Continued)

OTHER PUBLICATIONS

Hostis, S. et al., "Crystalline Structure of HfZrO Thin Films and ZrO2/HfO2 Bi-Layers Grown by AVD for MOS Applications," ECS Transactions, The Electrochemical Society, 13, 101-109, 2008, 10 pages.

*Primary Examiner* — Patricia D Valenzuela
(74) *Attorney, Agent, or Firm* — Slater Matsil, LLP

(57) ABSTRACT

Methods of forming decoupling capacitors in interconnect structures formed on backsides of semiconductor devices and semiconductor devices including the same are disclosed. In an embodiment, a device includes a device layer including a first transistor; a first interconnect structure on a front-side of the device layer; a second interconnect structure on a backside of the device layer, the second interconnect structure including a first dielectric layer on the backside of the device layer; a contact extending through the first dielectric layer to a source/drain region of the first transistor; a first conductive layer including a first conductive line electrically connected to the source/drain region of the first transistor through the contact; and a second dielectric layer adjacent the first conductive line, the second dielectric layer including a material having a k-value greater than 7.0, a first (Continued)

decoupling capacitor including the first conductive line and the second dielectric layer.

20 Claims, 63 Drawing Sheets

Related U.S. Application Data

(60) Provisional application No. 63/023,477, filed on May 12, 2020.

(51) Int. Cl.
*H01L 23/528* (2006.01)
*H01L 23/532* (2006.01)
*H01L 27/12* (2006.01)
H01L 21/768 (2006.01)
H01L 21/8238 (2006.01)
G11C 11/22 (2006.01)

(52) U.S. Cl.
CPC ...... *H01L 23/5329* (2013.01); *H01L 27/1211* (2013.01); *G11C 11/221* (2013.01); *H01L 21/7681* (2013.01); *H01L 21/823821* (2013.01); *H01L 23/528* (2013.01)

(58) Field of Classification Search
CPC ......... H01L 21/7681; H01L 21/823821; H01L 29/42392; H01L 29/66545; H01L 21/76897; H01L 29/4175; H01L 29/78696; H01L 21/823475; H01L 27/0629; H01L 29/0673; H01L 29/66439; H01L 29/775; H01L 29/7848; H01L 27/0924; H01L 21/76805; H01L 21/76895; H01L 21/823871; H01L 23/481; H01L 23/528; H01L 23/5283; H01L 29/0665; B82Y 10/00; B82Y 40/00; G11C 11/221
See application file for complete search history.

(56) References Cited

U.S. PATENT DOCUMENTS

| | | |
|---|---|---|
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,090,193 B1 | 10/2018 | Chanemougame et al. |
| 10,439,565 B2 | 10/2019 | Goktepeli |
| 10,756,210 B2 | 8/2020 | Jan et al. |
| 2007/0296002 A1 | 12/2007 | Iang et al. |
| 2009/0065853 A1 | 3/2009 | Hanafi |
| 2010/0133617 A1 | 6/2010 | Hanafi |
| 2014/0367757 A1 | 12/2014 | Jakushokas et al. |
| 2015/0035103 A1 | 2/2015 | Inoue |
| 2019/0140061 A1 | 5/2019 | Chu-King et al. |
| 2019/0341297 A1* | 11/2019 | Lilak ............... H01L 21/823481 |
| 2020/0098676 A1* | 3/2020 | Elsherbini ........... H01L 21/6835 |
| 2020/0105774 A1* | 4/2020 | Penumatcha ......... G11C 11/221 |
| 2020/0105875 A1* | 4/2020 | Li ...................... H01L 21/3083 |

FOREIGN PATENT DOCUMENTS

| | | |
|---|---|---|
| JP | 2002124636 A | 4/2002 |
| KR | 20170016325 A | 2/2017 |
| TW | 201824551 A | 7/2018 |
| WO | 2015195152 A1 | 12/2015 |

* cited by examiner

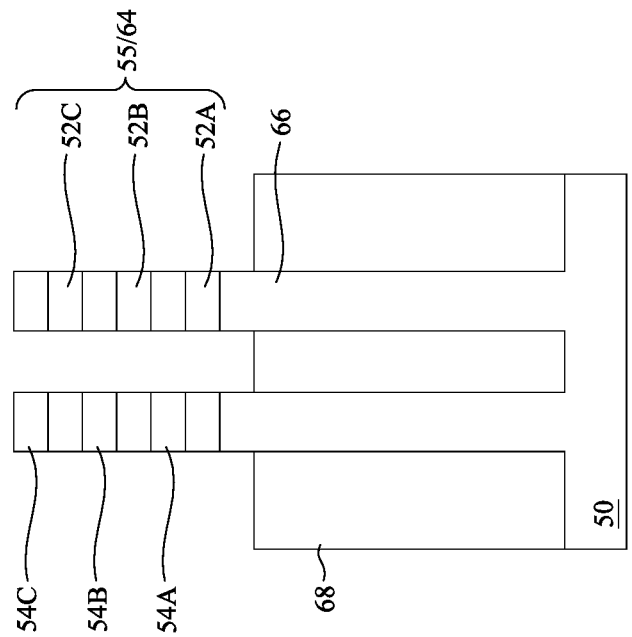
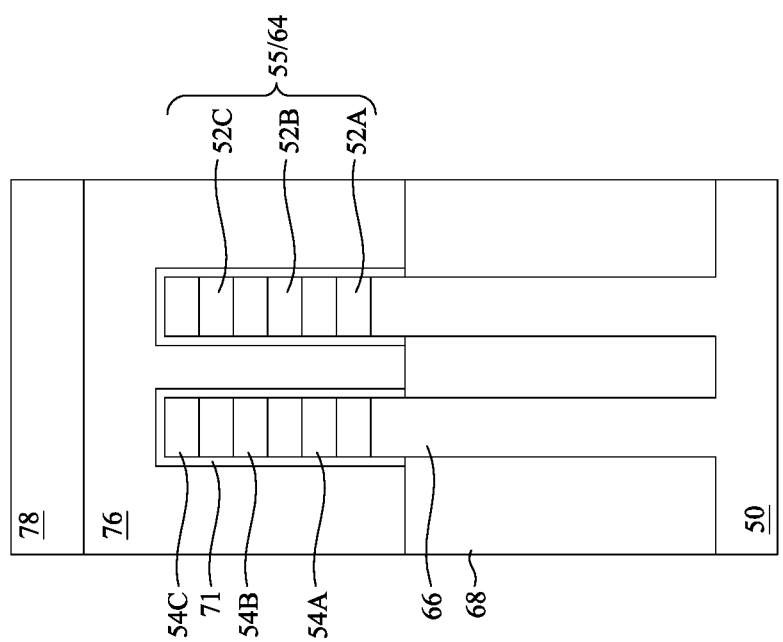

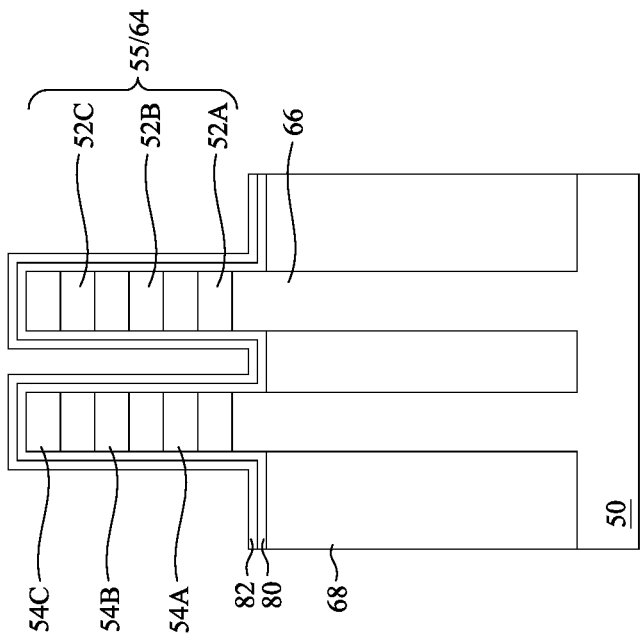
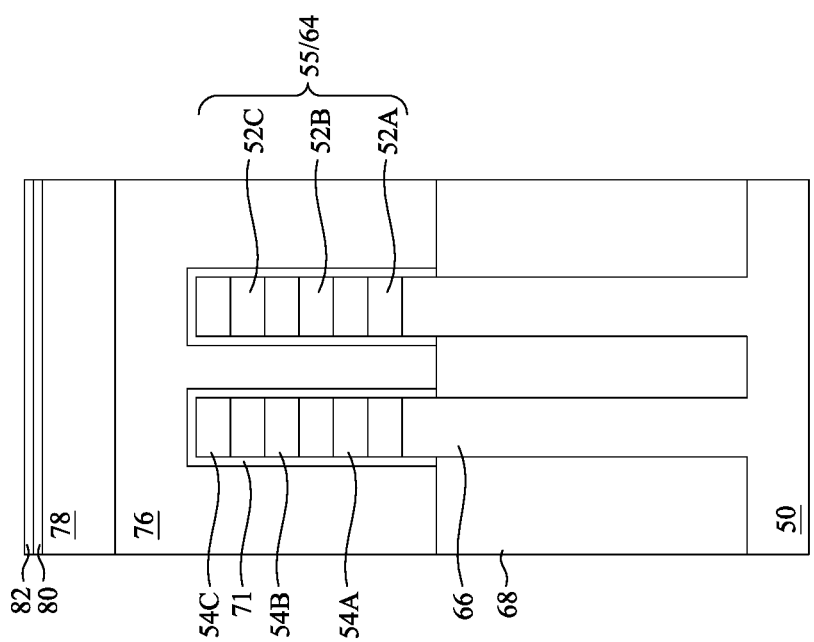

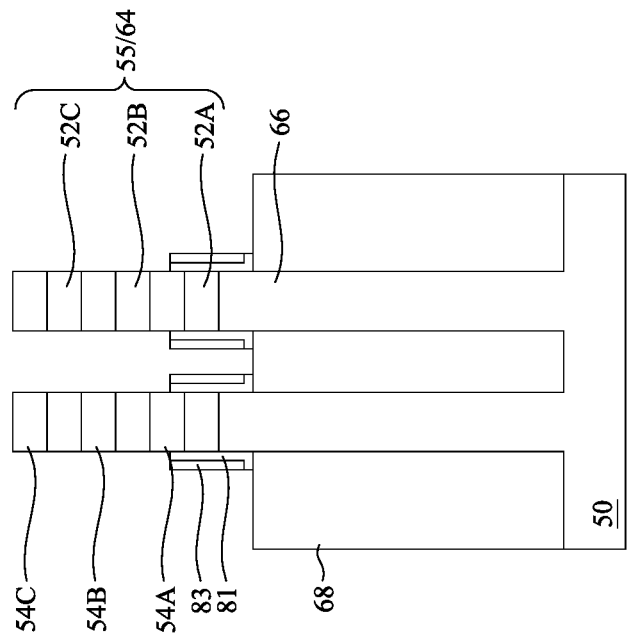
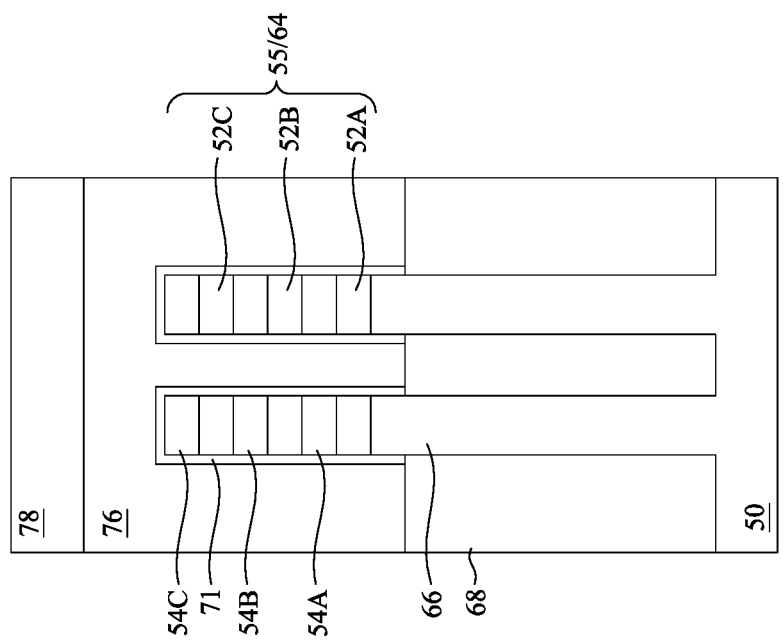
Fig. 8B
Fig. 8A

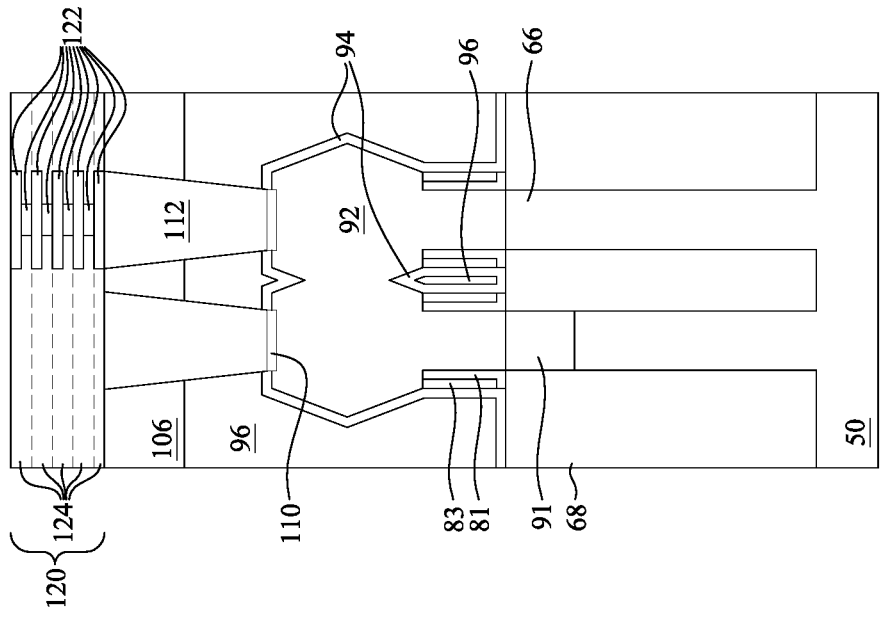
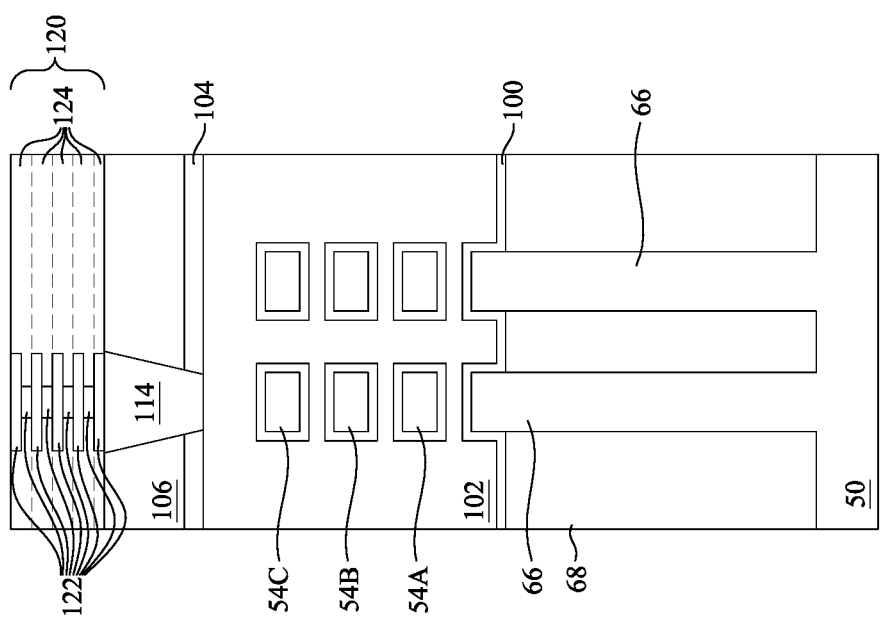
Fig. 21B
Fig. 21A

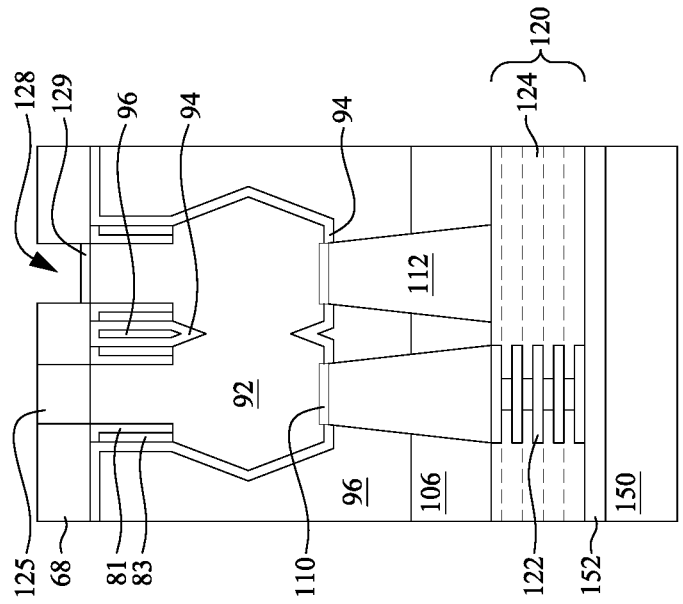
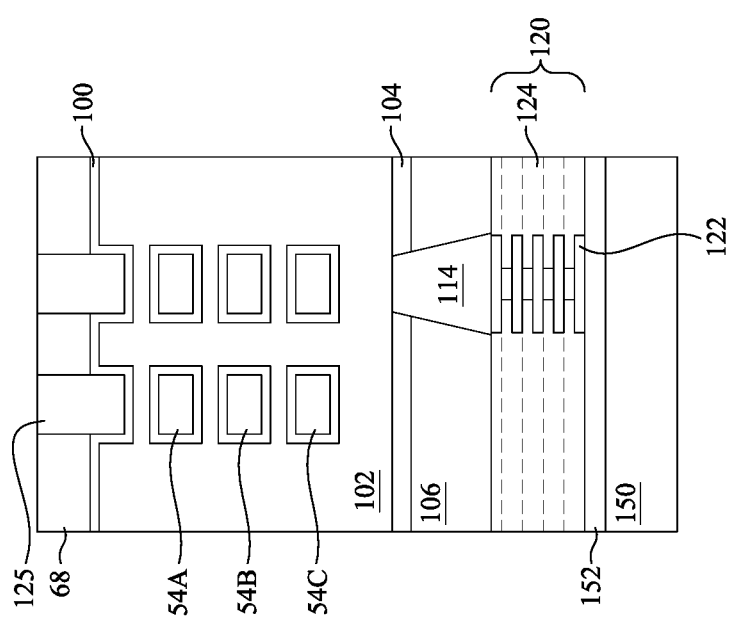

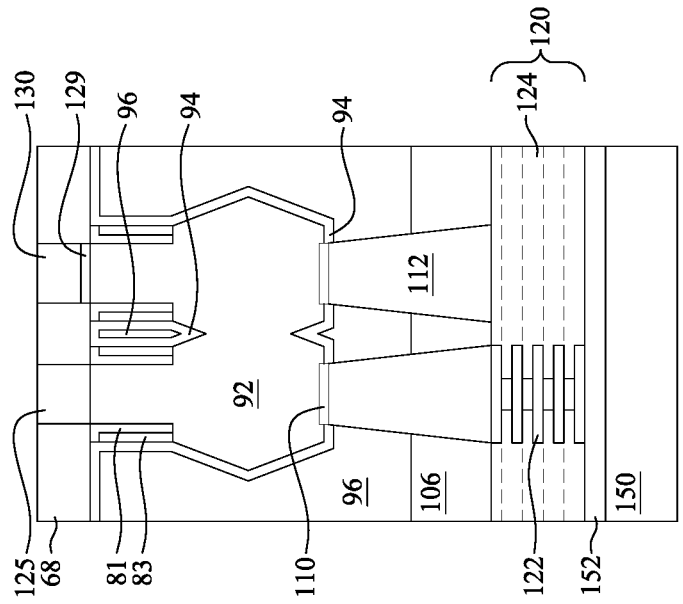
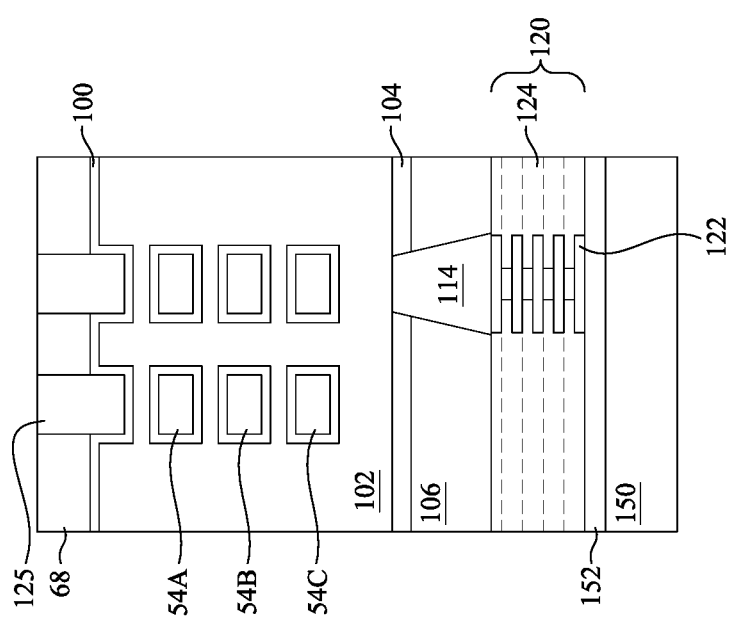
Fig. 26B
Fig. 26A

SEMICONDUCTOR DEVICES INCLUDING DECOUPLING CAPACITORS

PRIORITY CLAIM AND CROSS-REFERENCE

This application is a divisional of U.S. patent application Ser. No. 17/004,768, entitled "Semiconductor Devices Including Decoupling Capacitors," filed on Aug. 27, 2020, which claims the benefit of U.S. Provisional Application No. 63/023,477, filed on May 12, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 27D, 28A, 28B, 28C, 28D, 28E, 28F, 28G, 28I, 29A, 29B, and 29C are cross-sectional views of intermediate stages in the manufacturing of nano-FETs, in accordance with some embodiments.

DETAILED DESCRIPTION

Figure 1:
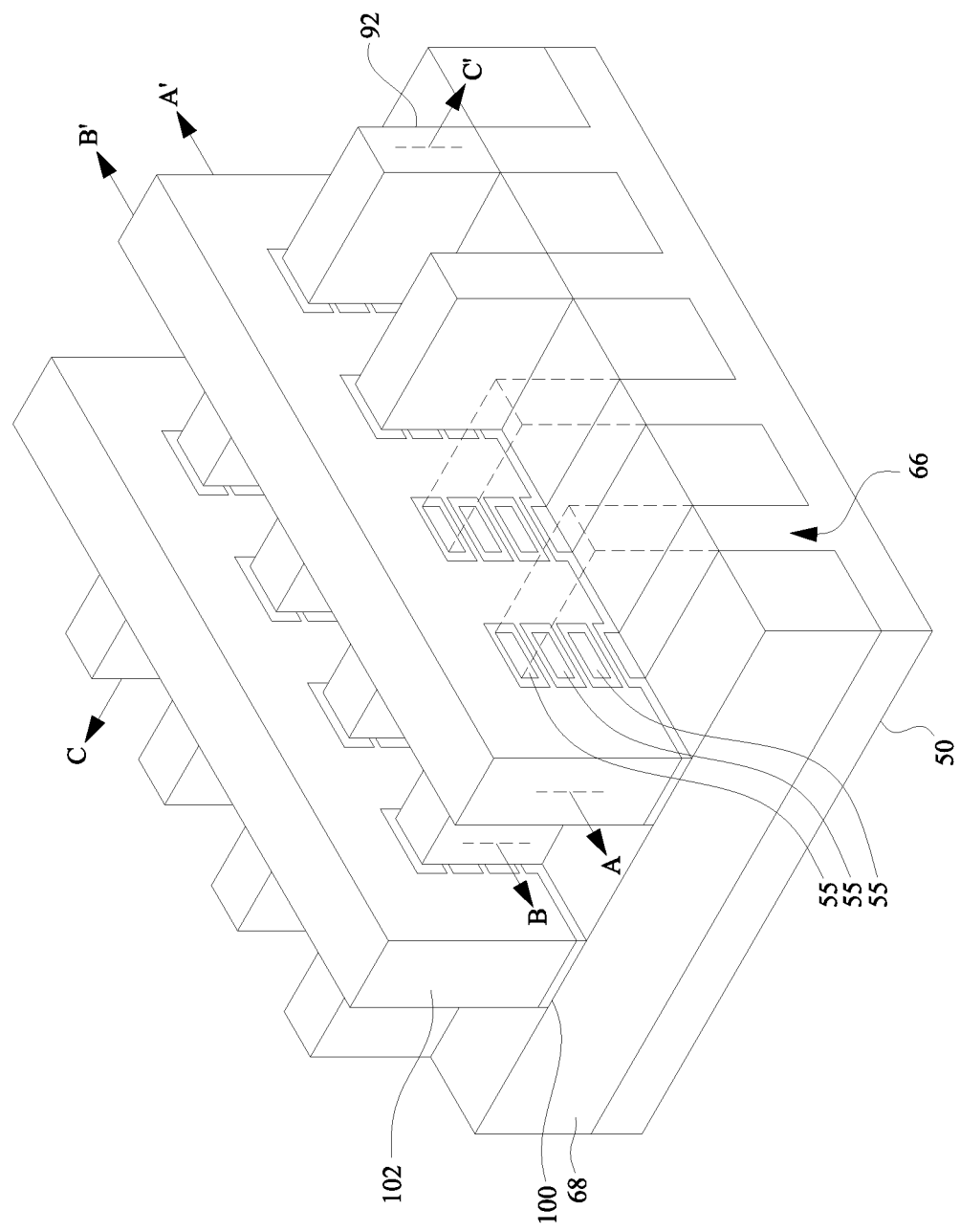
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming decoupling capacitors in semiconductor devices and semiconductor devices including the same. In some embodiments, the decoupling capacitors may be formed in an interconnect structure on a backside of a semiconductor chip including the semiconductor devices. The backside interconnect structure may be routed for power supply lines and electrical ground lines and the decoupling capacitors may be formed by filling spaces in between the power supply lines and the electrical ground lines with high-k dielectric materials or the like. In some embodiments, decoupling capacitors may also be formed in an interconnect structure on a front side of the semiconductor chip. The decoupling capacitors may stabilize the power supply lines and the electrical ground lines, resulting in improved device performance. Moreover, routing the power supply lines and the electrical ground lines through the backside interconnect structure and forming the decoupling capacitors in the backside interconnect structure may reduce the area used to form decoupling capacitors, which increases device density. Forming the decoupling capacitors including high-k dielectric materials (e.g., dielectric materials having k-values greater than about 7.0) allows for the decoupling capacitors to hold greater charges, while minimizing the size of the decoupling capacitors.

Some embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 29C are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, and 29A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, 25B, 26B, 27B, 28B, and 29B illustrate reference cross-section B-B' illustrated in FIG. 1. FIGS. 7C, 8C, 9C, 10C, 11C, 11D, 12C, 12E, 13C, 14C, 15C, 16C, 17C, 18C, 19C, 20C, 21C, 22C, 23C, 24C, 25C, 26C, 27C, 27D, 28C, 28E, 28F, 28G, 28I, and 29C illustrate reference cross-section C-C' illustrated in FIG. 1.

Figure 2:
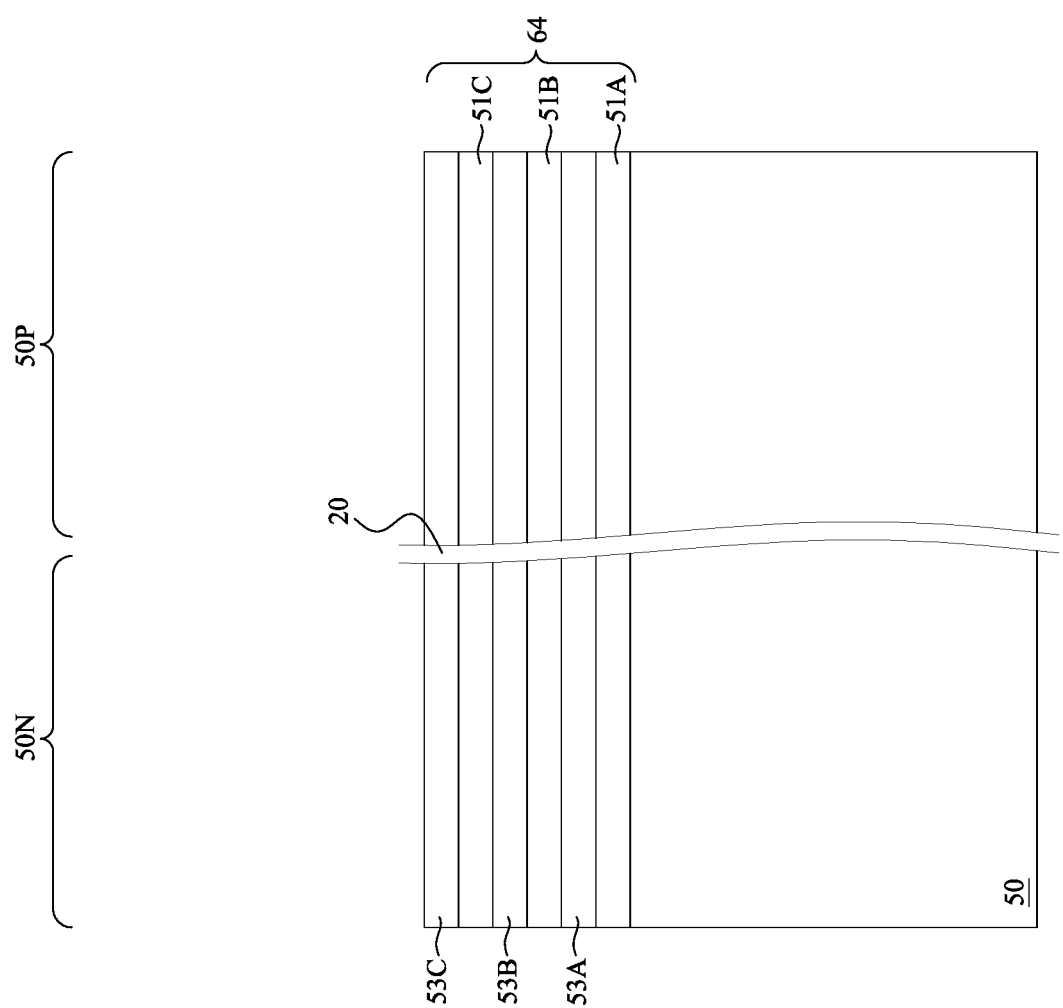

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
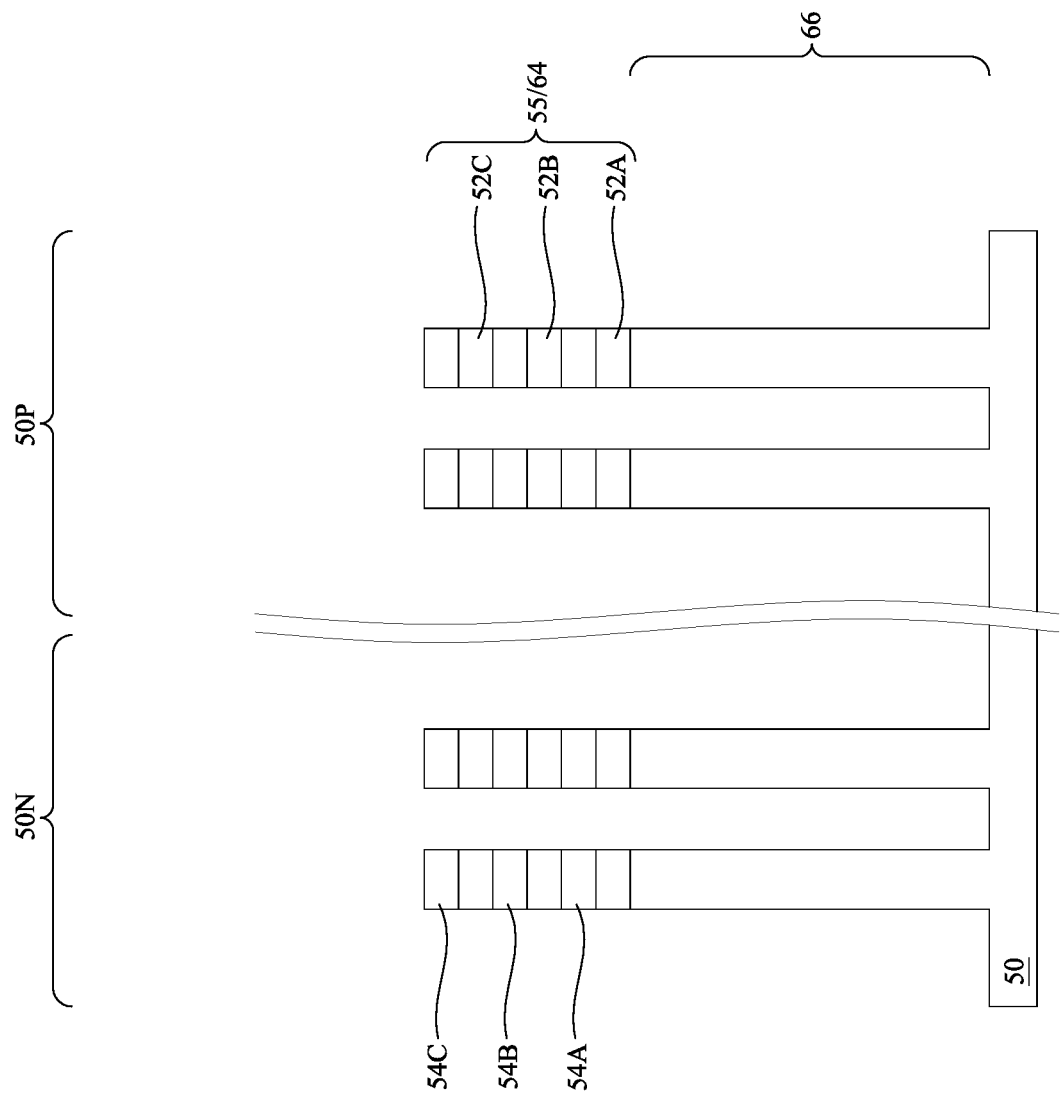

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
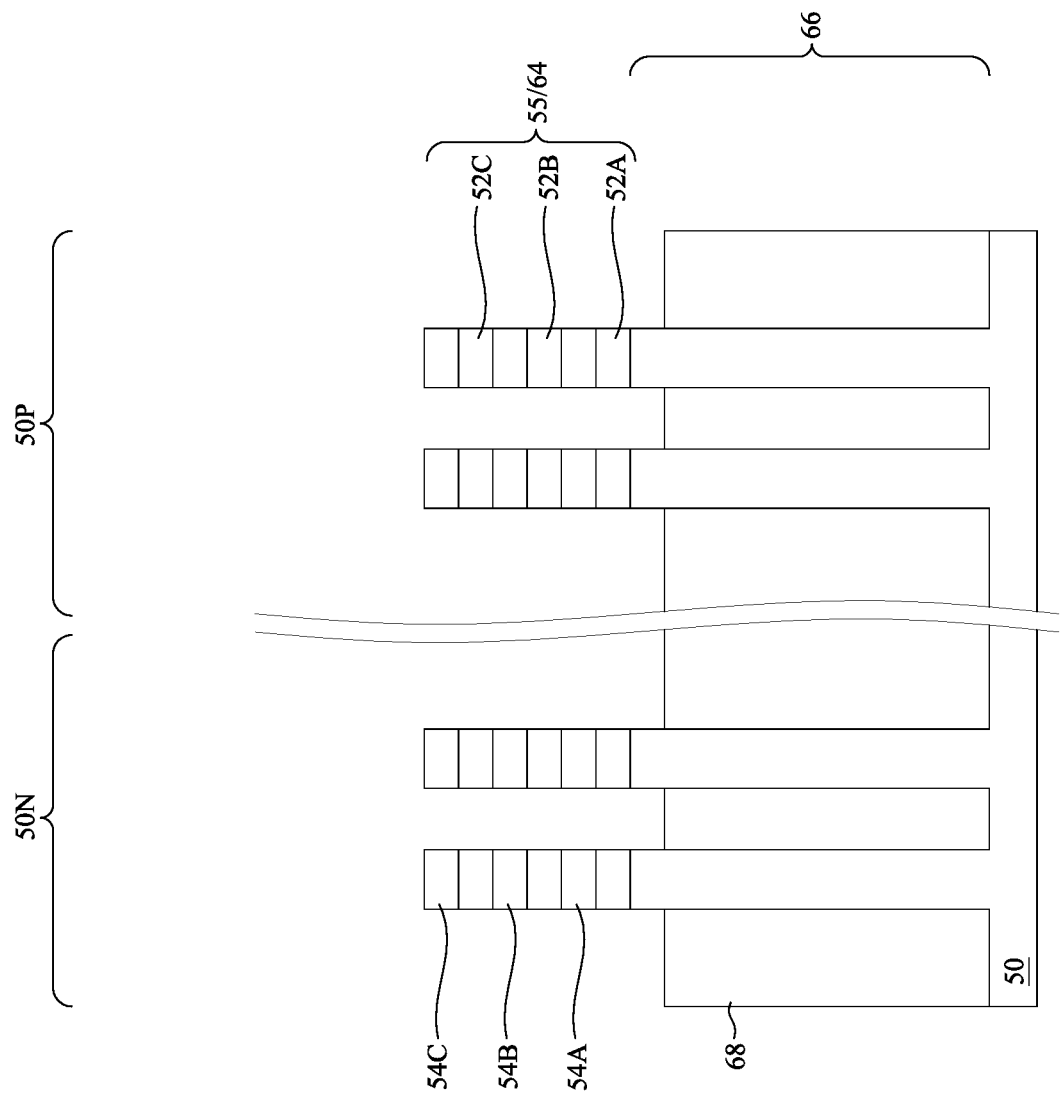

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
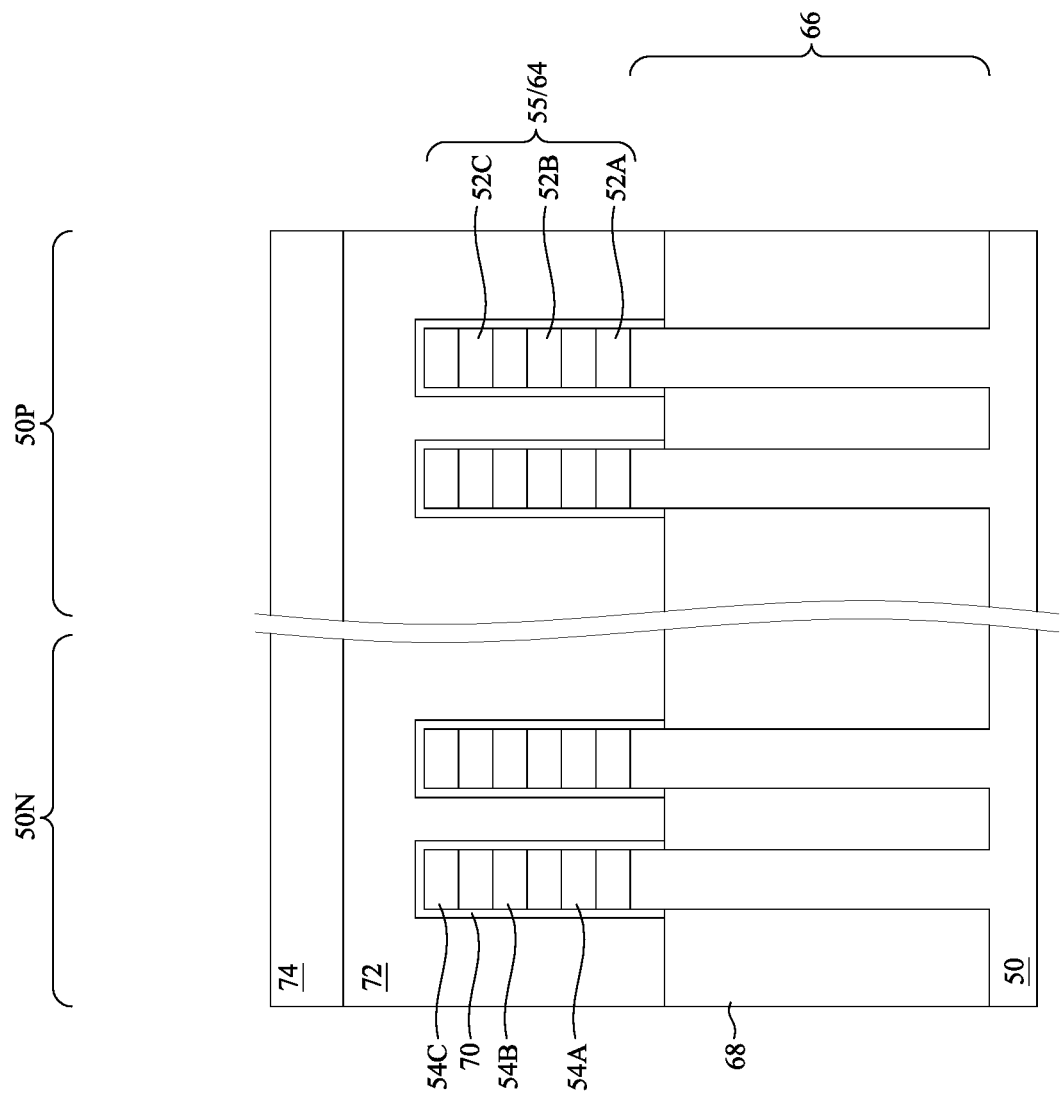

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6C:
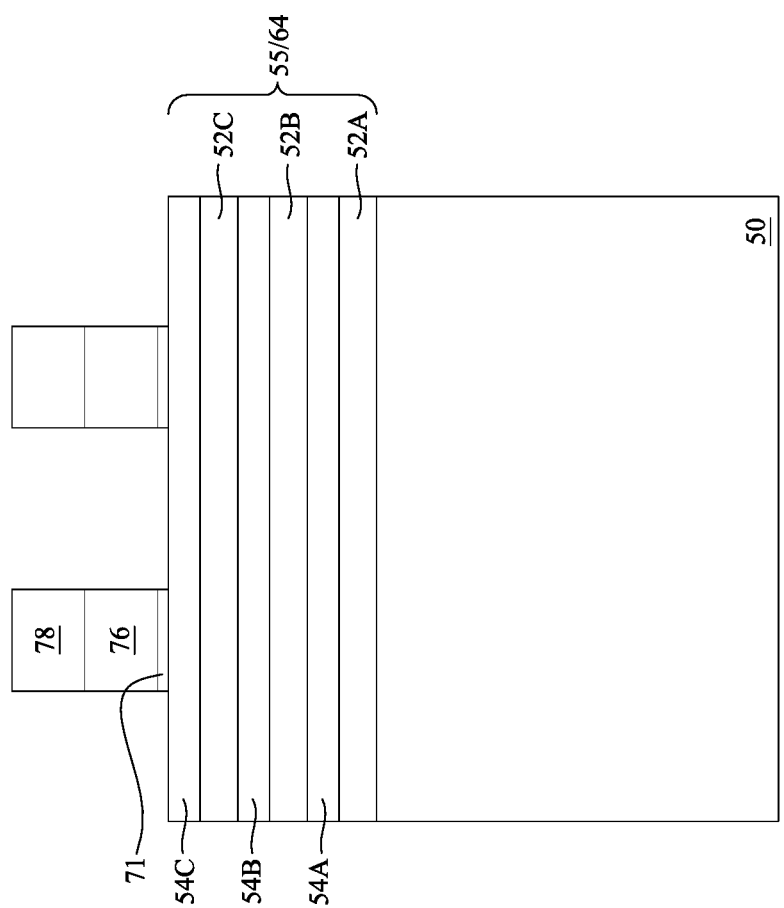

FIGS. 6A through 18C illustrate various additional steps in the manufacturing of embodiment devices. FIGS. 6A through 18C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7C:
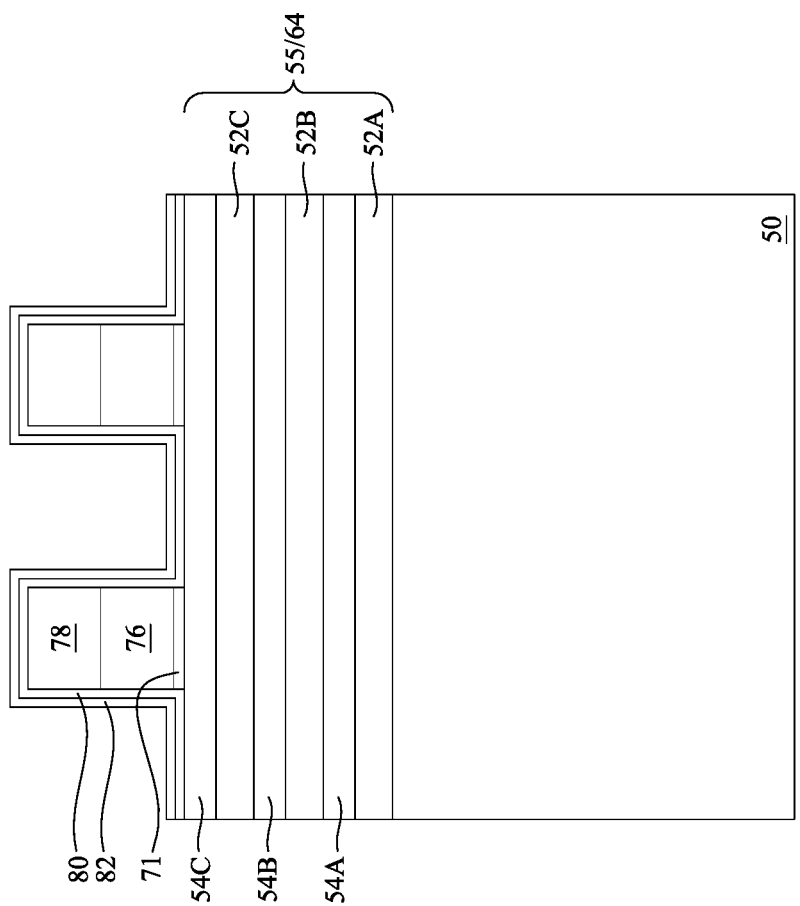

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8C:
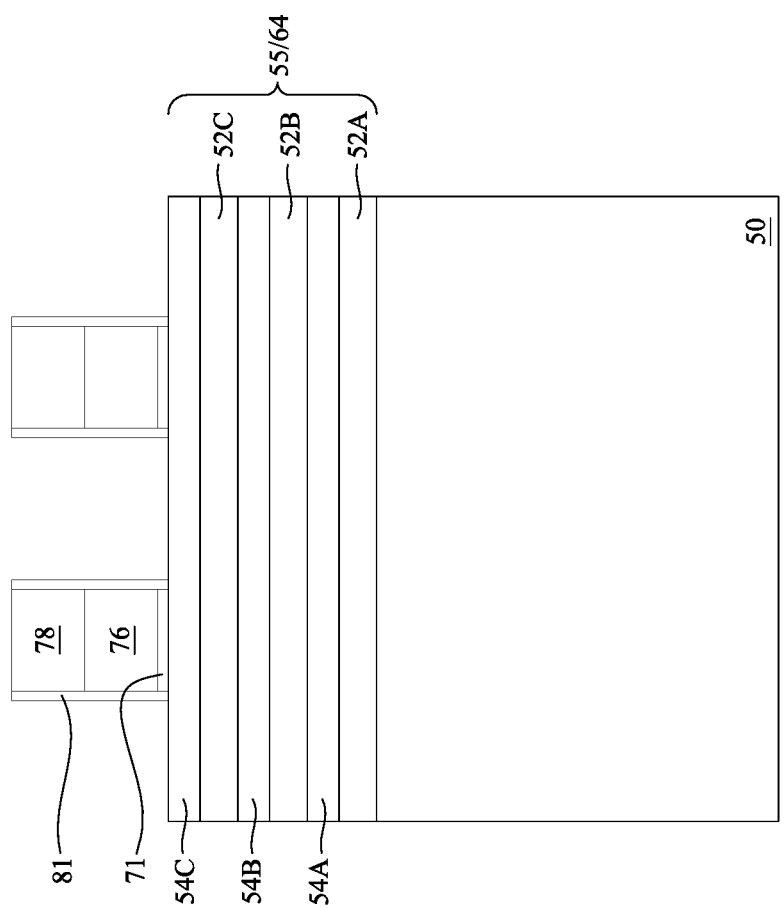

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
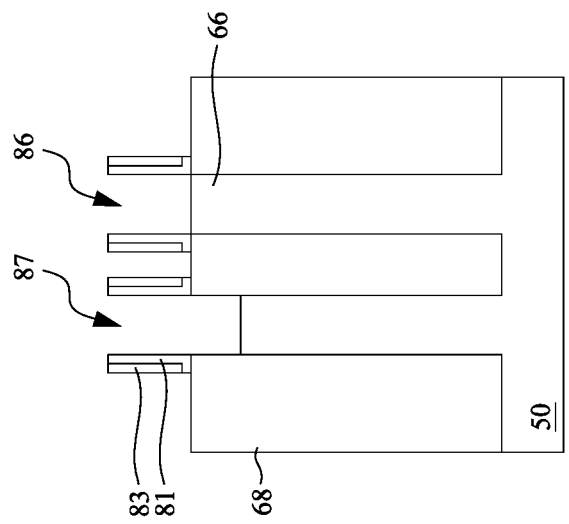
Figure 9A:
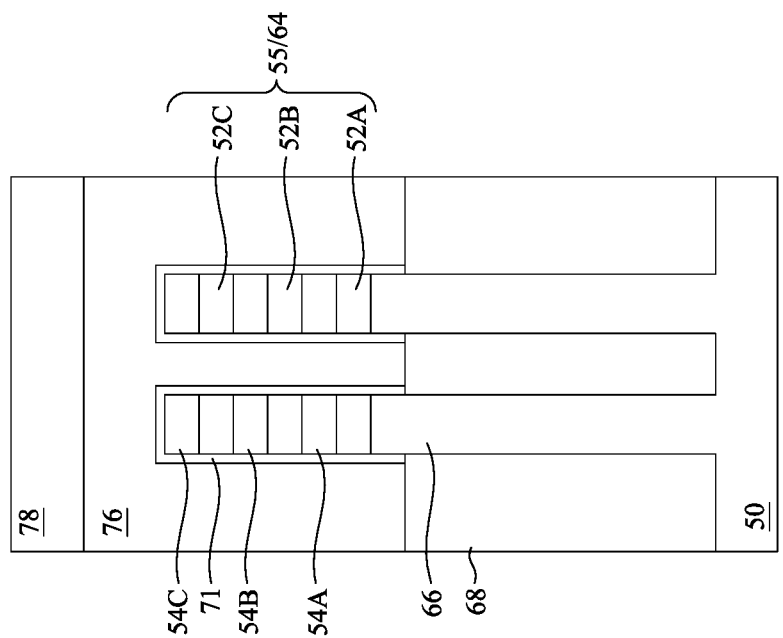
Figure 9C:
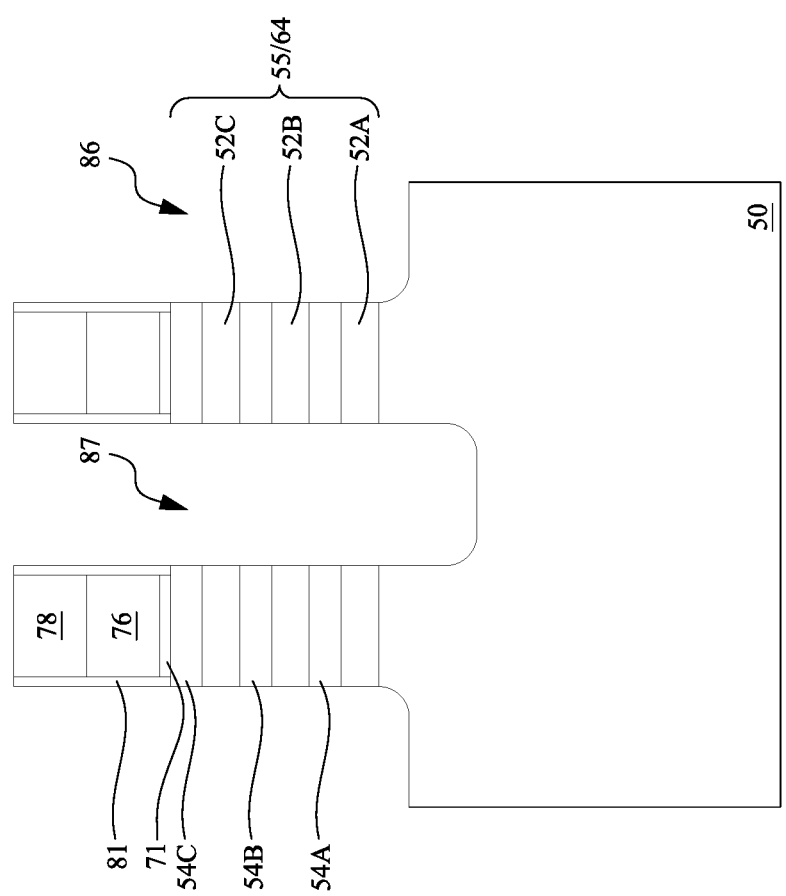

In FIGS. 9A through 9C, first recesses 86 and second recesses 87 are formed in the fins 66, the nanostructures 55, and the substrate 50, in accordance with some embodiments. Epitaxial source/drain regions will be subsequently formed in the first recesses 86 and first epitaxial materials and epitaxial source/drain regions will be subsequently formed in the second recesses 87. The first recesses 86 and the second recesses 87 may extend through the first nanostructures 52 and the second nanostructures 54, and into the substrate 50. As illustrated in FIG. 9B, top surfaces of the STI regions 68 may be level with bottom surfaces of the first recesses 86. In various embodiments, the fins 66 may be etched such that bottom surfaces of the first recesses 86 are disposed below the top surfaces of the STI regions 68 or the like. Bottom surfaces of the second recesses 87 may be disposed below the bottom surfaces of the first recesses 86 and the top surfaces of the STI regions 68. The first recesses 86 and the second recesses 87 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86 and the second recesses 87. A single etch process or multiple etch processes may be used to etch each layer of the nanostructures 55 and/or the fins 66. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 10B:
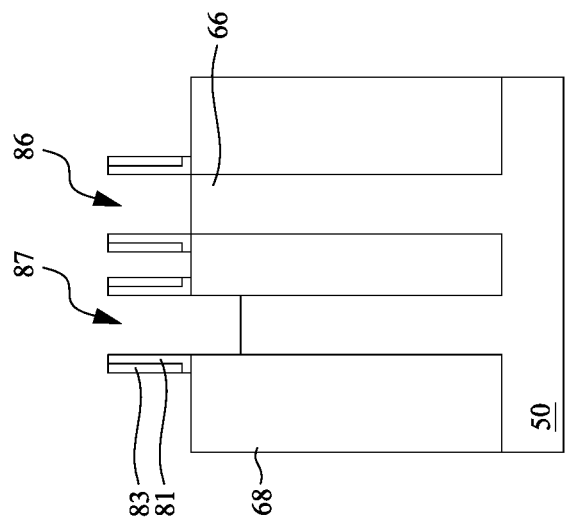
Figure 10A:
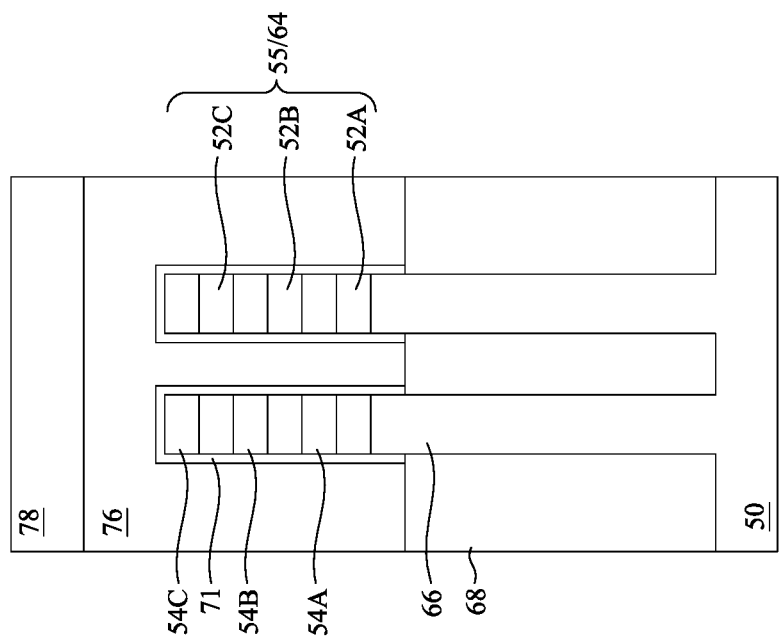
Figure 10C:
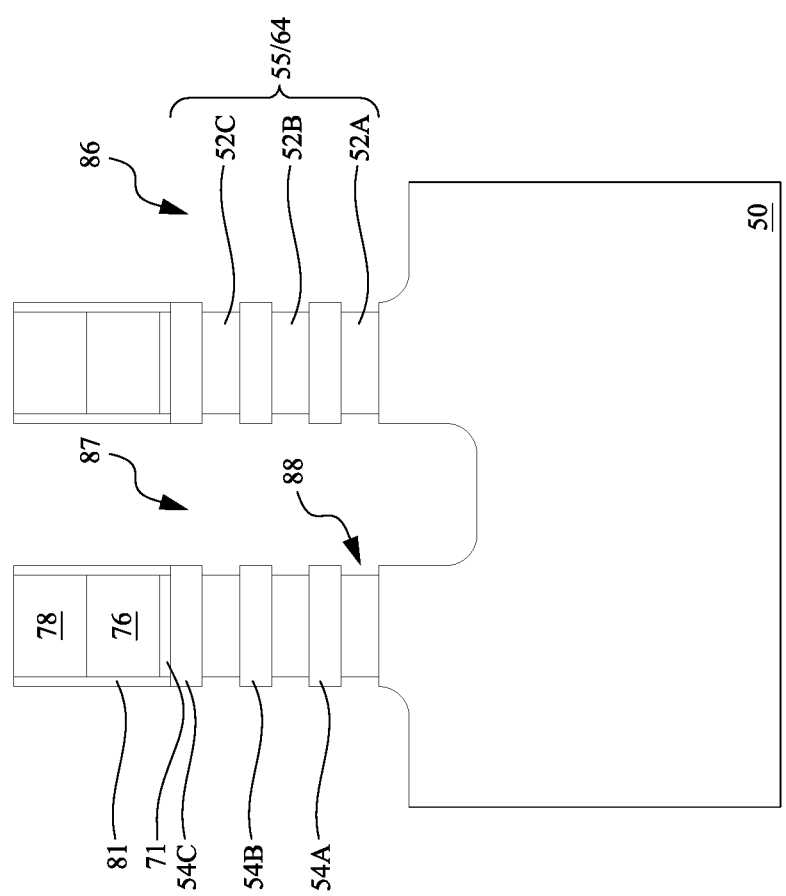

In FIGS. 10A through 10C, portions of sidewalls of the layers of the multi-layer stack 64 formed of the first semiconductor materials (e.g., the first nanostructures 52) exposed by the first recesses 86 and the second recesses 87 are etched to form sidewall recesses 88. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and a gate structure. As will be discussed in greater detail below, source/drain regions and epitaxial materials will be formed in the first recesses 86 and the second recesses 87, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 11B:
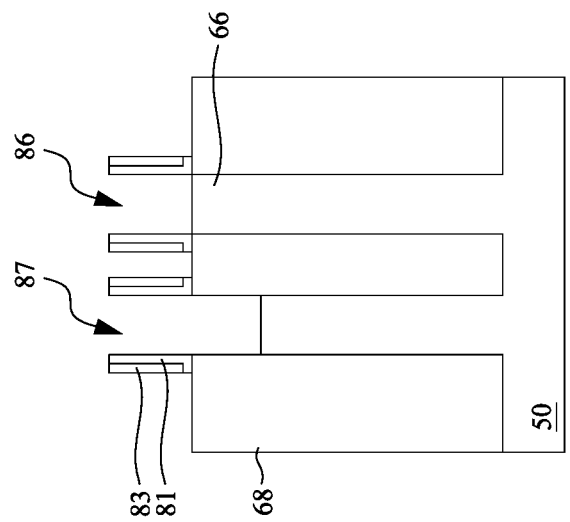
Figure 11A:
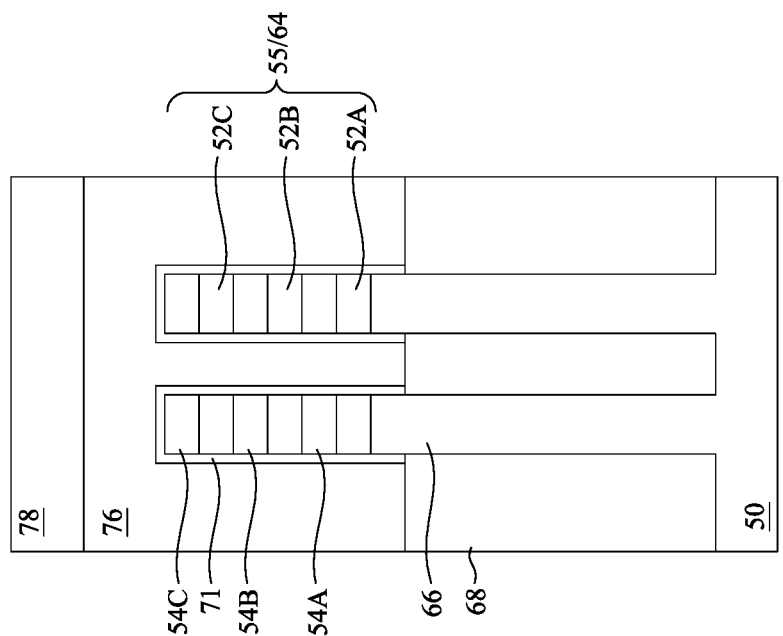
Figure 11C:
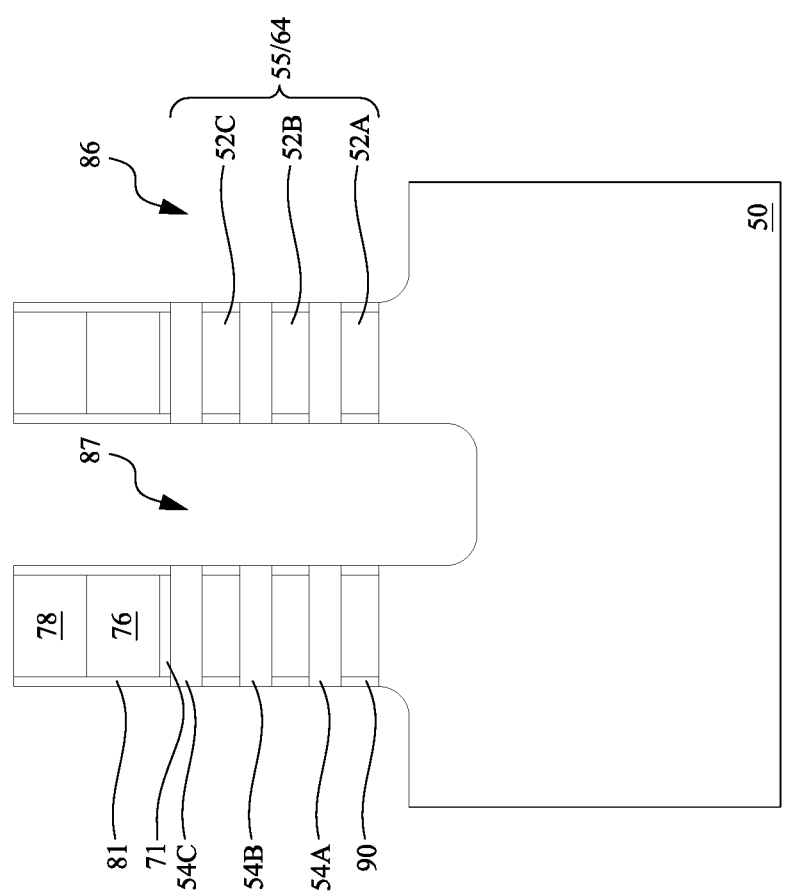
Figure 11D:
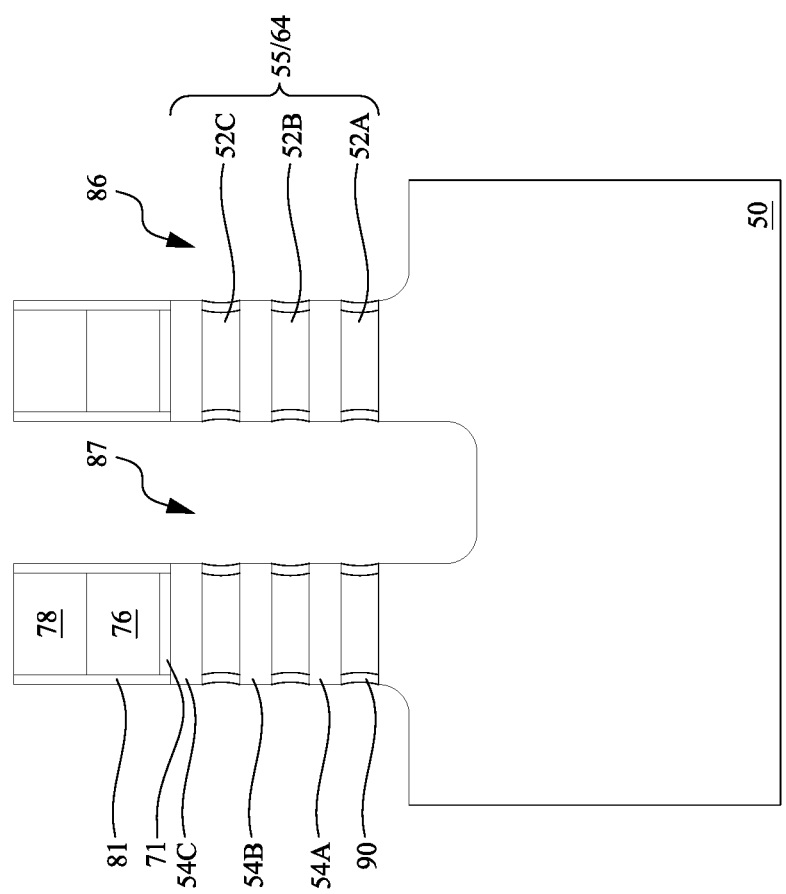

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

In FIGS. 12A through 12E, first epitaxial materials 91 are formed in the second recesses 87 and epitaxial source/drain regions 92 are formed in the first recesses 86 and the second recesses 87. In some embodiments, the first epitaxial materials 91 may be sacrificial materials, which are subsequently removed to form backside vias (such as the backside vias 130, discussed below with respect to FIGS. 26A through 26C). As illustrated in FIGS. 12B through 12E, top surfaces of the first epitaxial materials 91 may be level with bottom surfaces of the first recesses 86. However, in some embodiments, top surfaces of the first epitaxial materials 91 may be disposed above or below bottom surfaces of the first recesses 86. The first epitaxial materials 91 may be epitaxially grown in the second recesses 87 using a process such as chemical vapor deposition (CVD), atomic layer deposition (ALD), vapor phase epitaxy (VPE), molecular beam epitaxy (MBE), or the like. The first epitaxial materials 91 may include any acceptable material, such as silicon germanium or the like. The first epitaxial materials 91 may be formed of materials having high etch selectivity to materials of the epitaxial source/drain regions 92, the substrate 50, and dielectric layers (such as the STI regions 68 and second dielectric layers 125, discussed below with respect to FIGS. 24A through 24C). As such, the first epitaxial materials 91 may be removed and replaced with the backside vias without significantly removing the epitaxial source/drain regions 92 and the dielectric layers.

Figure 12B:
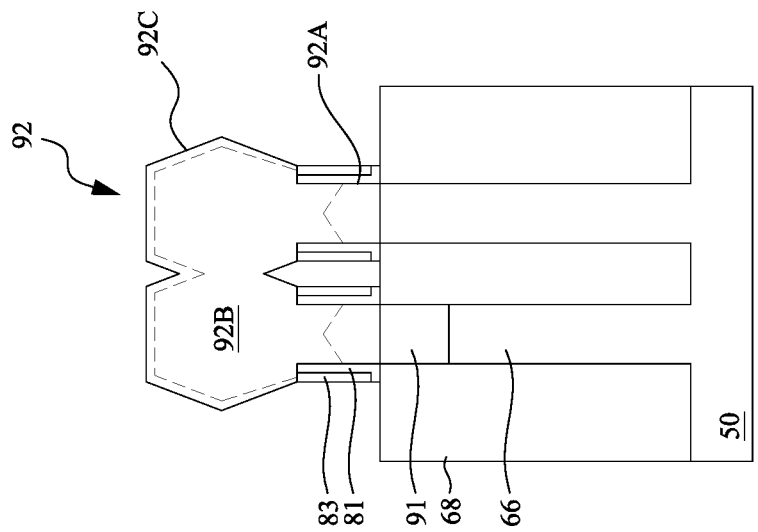

The epitaxial source/drain regions 92 are then formed in the first recesses 86 and over the first epitaxial materials 91 in the second recesses 87. In some embodiments, the epitaxial source/drain regions 92 may exert stress on the second nanostructures 54, thereby improving performance. As illustrated in FIG. 12C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12B. In other embodiments, adjacent epitaxial source/drain regions 92 remain separated after the epitaxy process is completed as illustrated by FIG. 12D. In the embodiments illustrated in FIGS. 12B and 12D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12A:
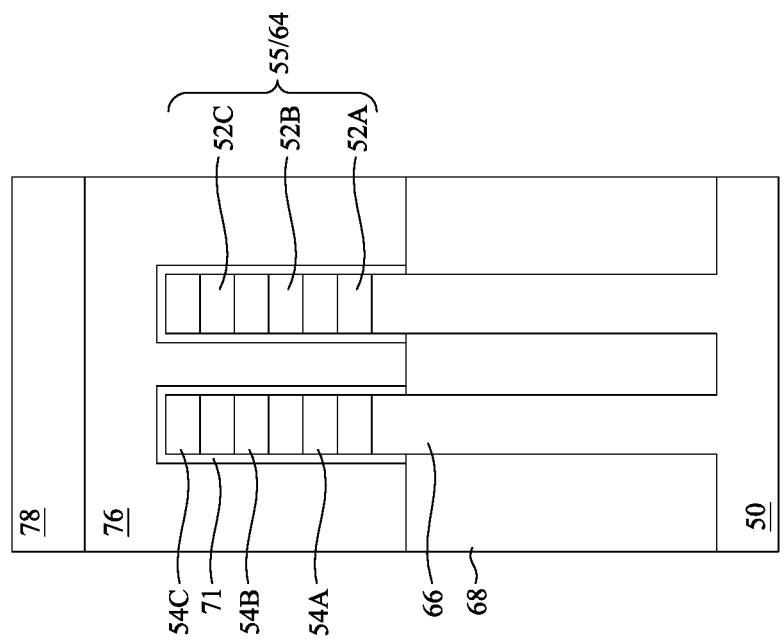
Figure 12C:
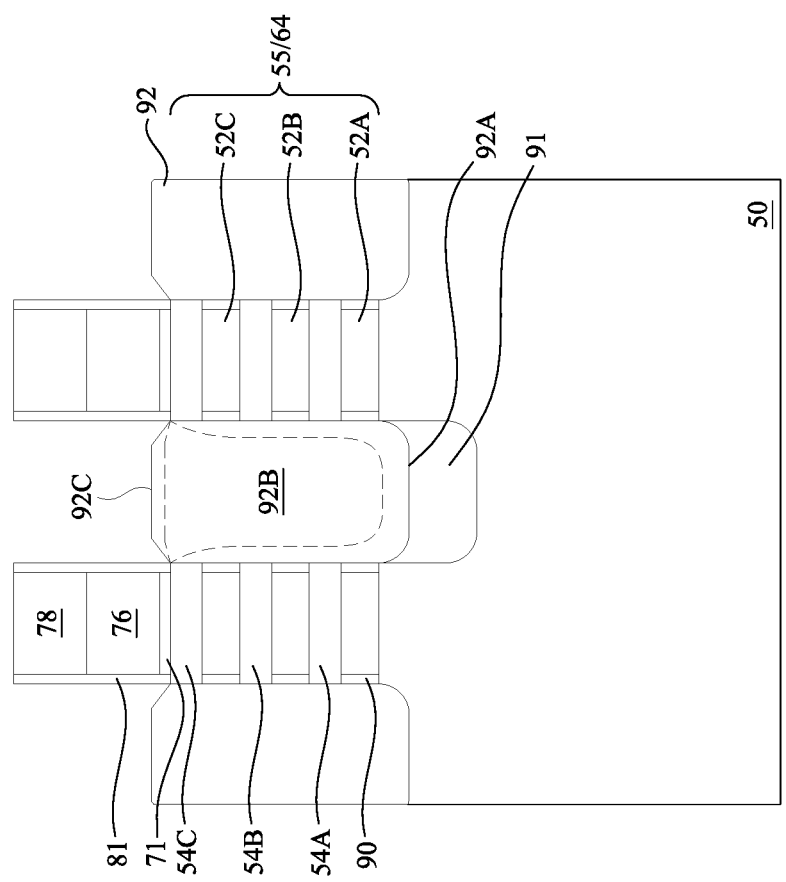
Figure 12D:
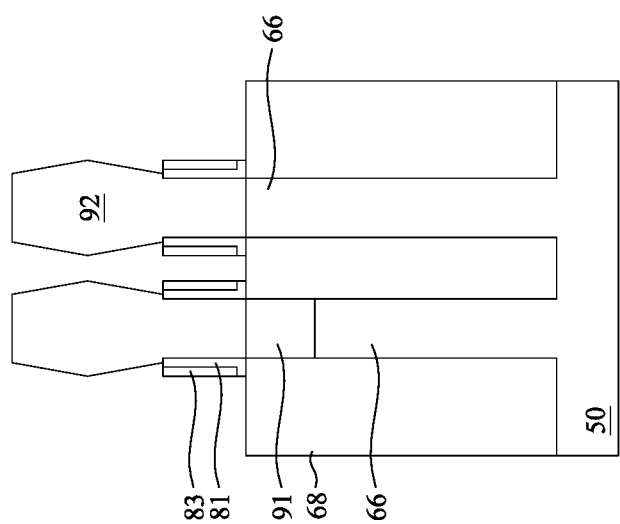
Figure 12E:
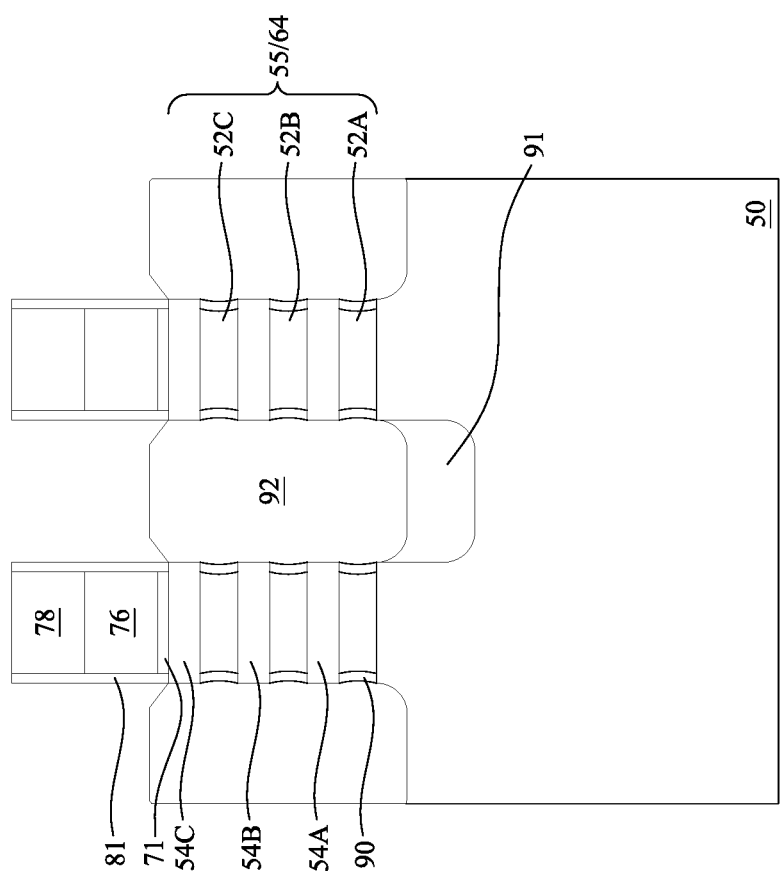

FIG. 12E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12E, the epitaxial source/drain regions 92 may be formed in contact with the first inner spacers 90 and may extend past sidewalls of the second nanostructures 54.

Figure 13B:
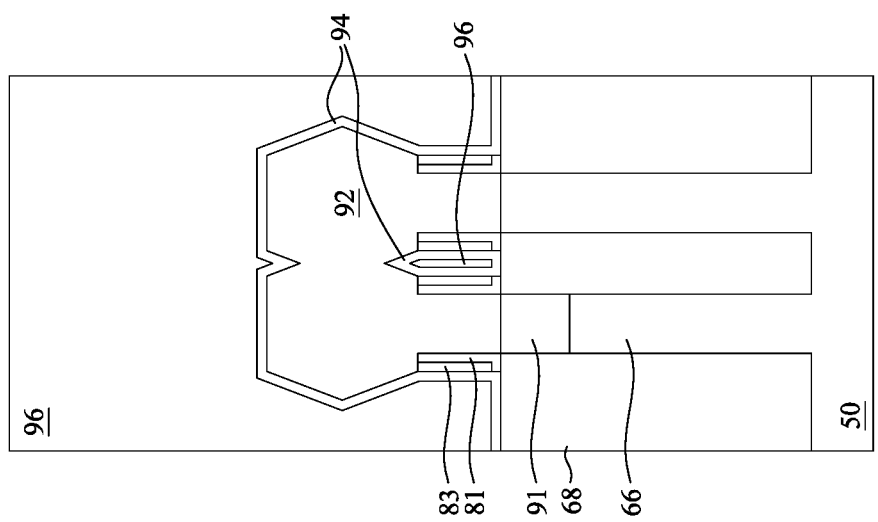
Figure 13A:
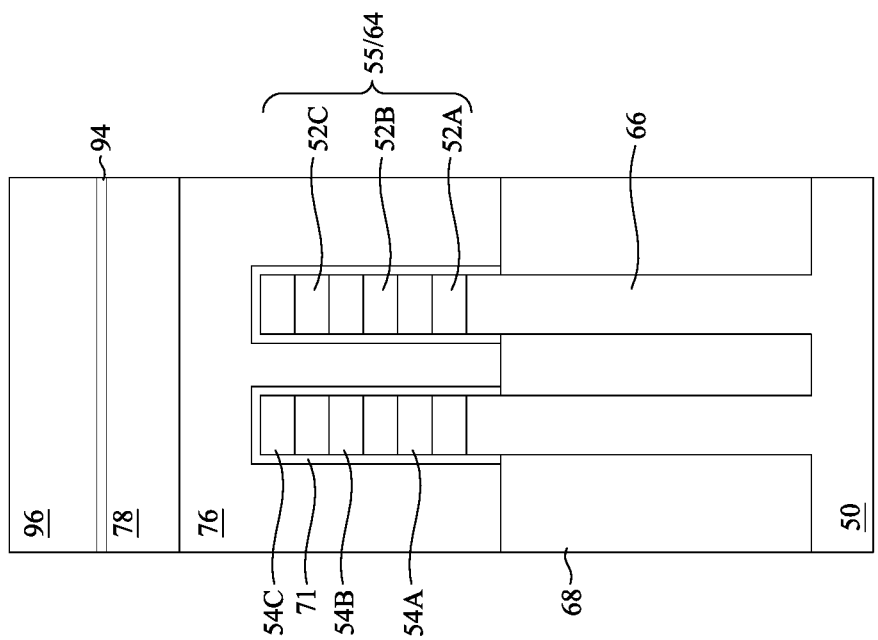
Figure 13C:
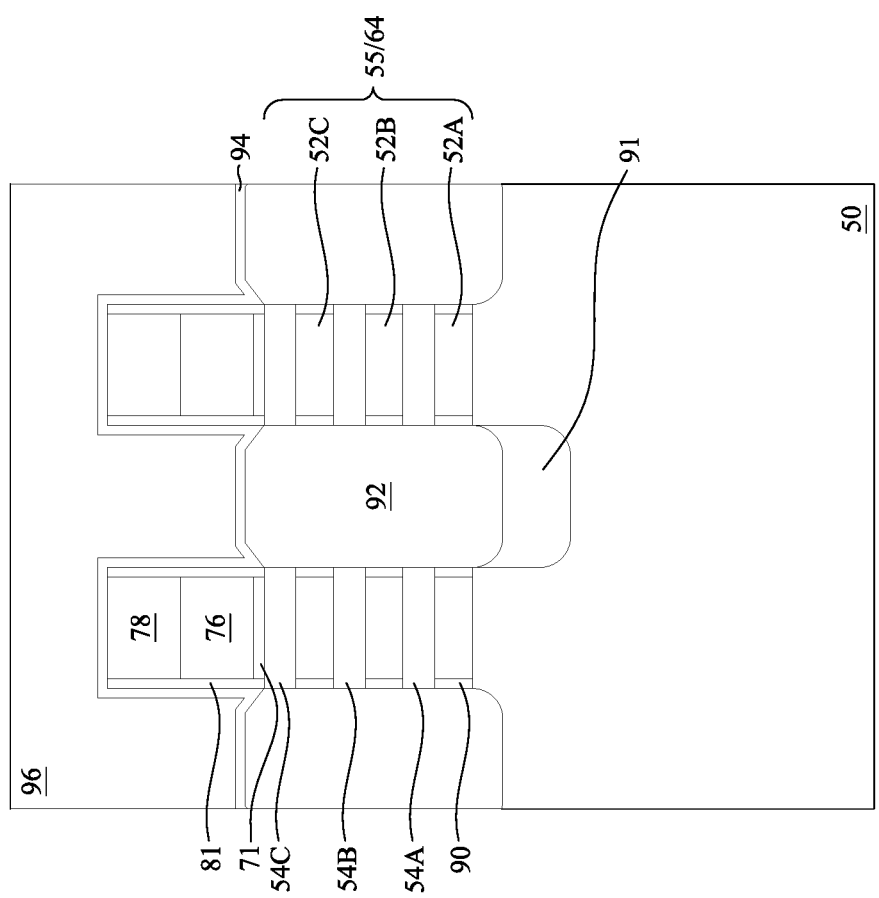

In FIGS. 13A through 13C, a first interlayer dielectric (ILD) 96 is deposited over the structure illustrated in FIGS. 12A through 12C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14B:
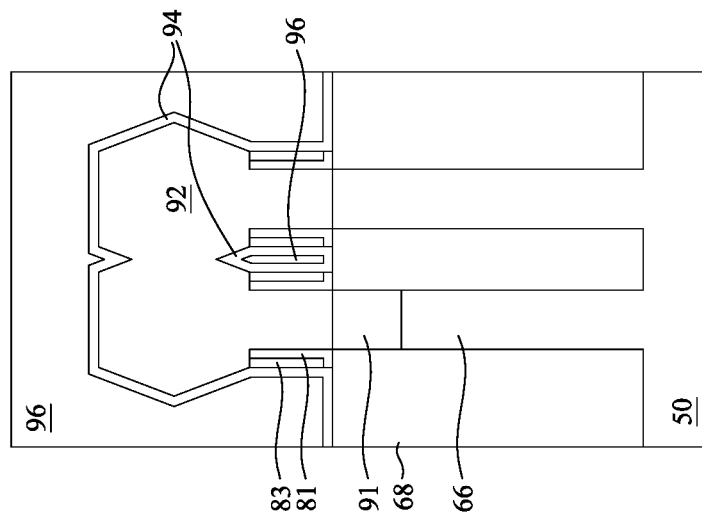
Figure 14A:
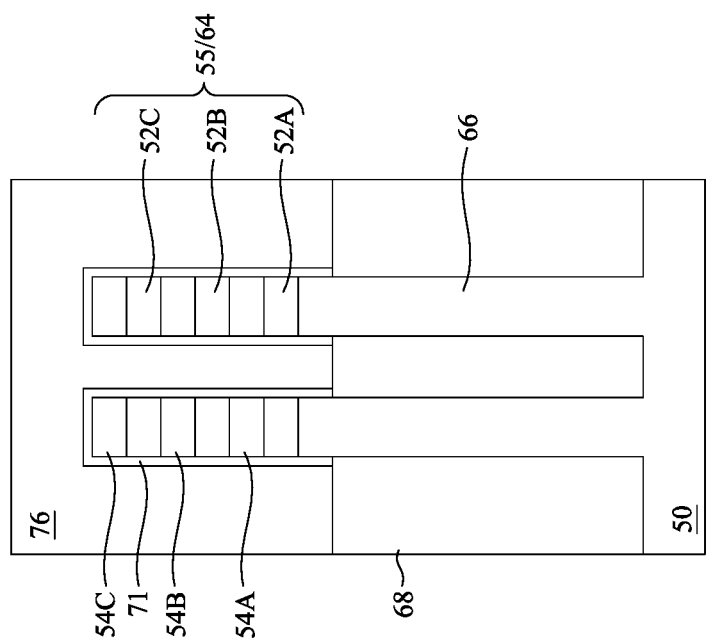
Figure 14C:
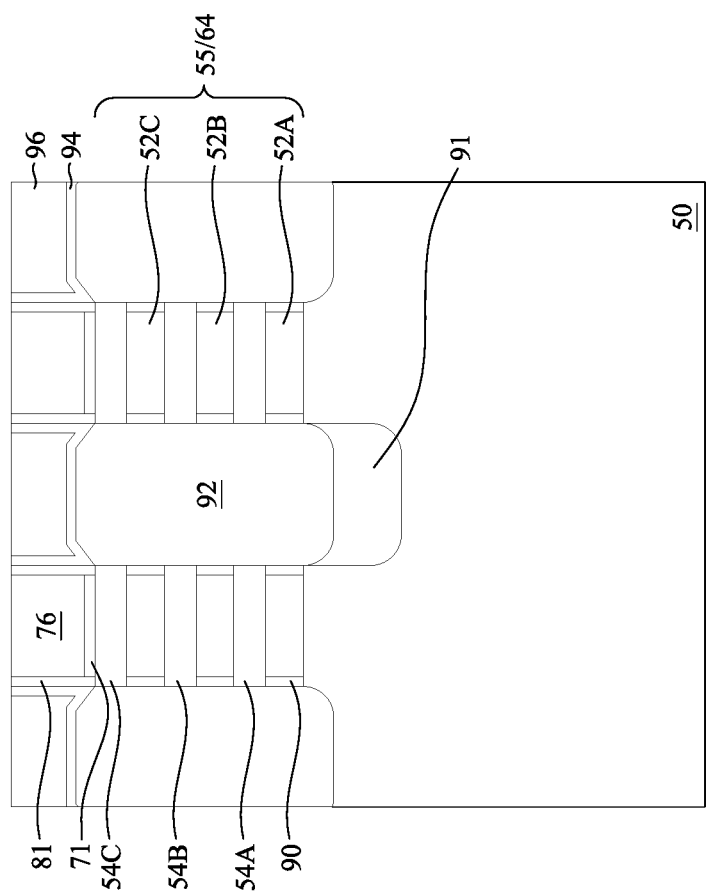

In FIGS. 14A through 14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15B:
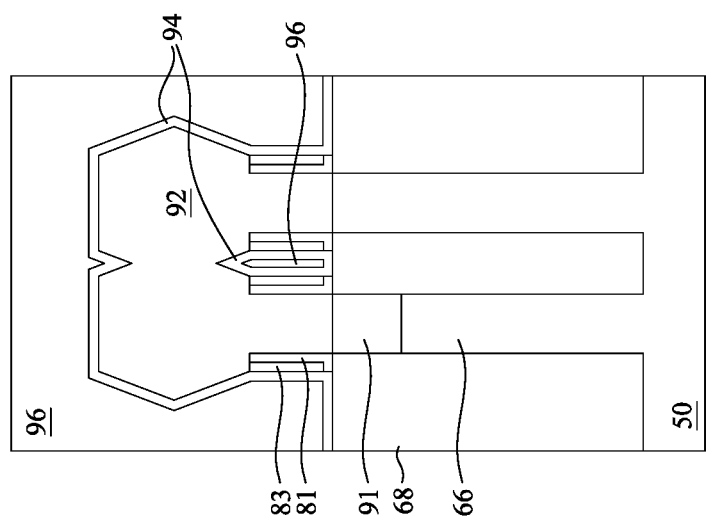
Figure 15A:
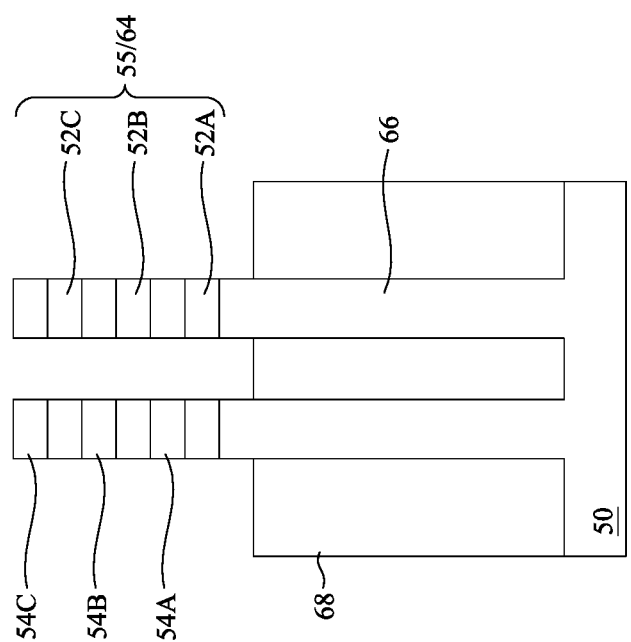
Figure 15C:
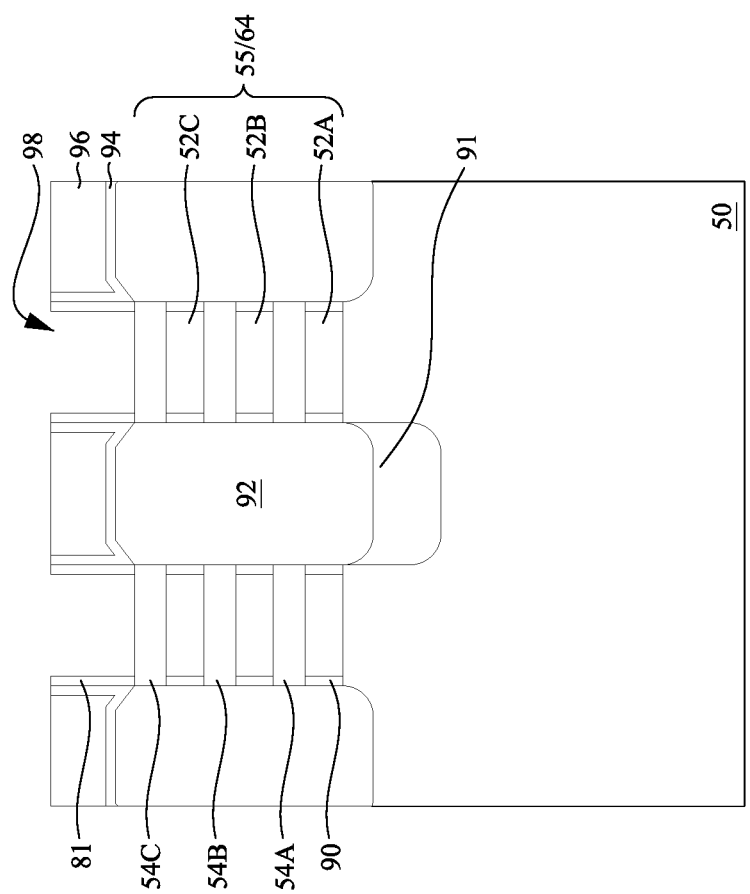

In FIGS. 15A through 15C, the dummy gates 76, and the masks 78 if present, are removed in one or more etching steps, so that third recesses 98 are formed. Portions of the dummy gate dielectrics 71 in the third recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nanoFETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16B:
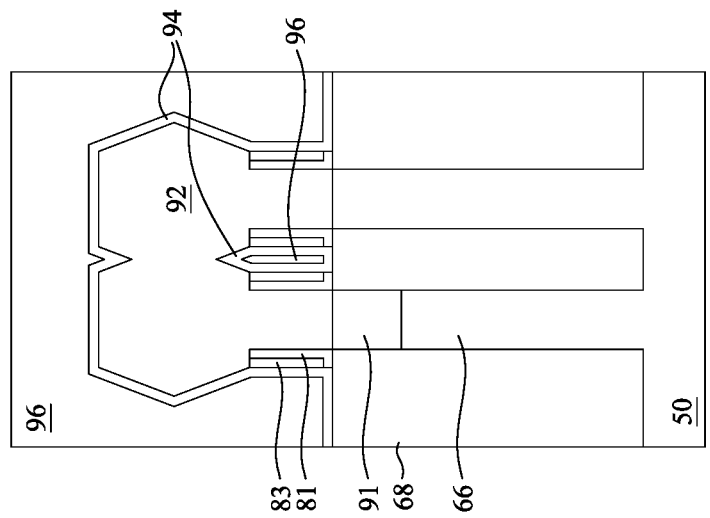
Figure 16A:
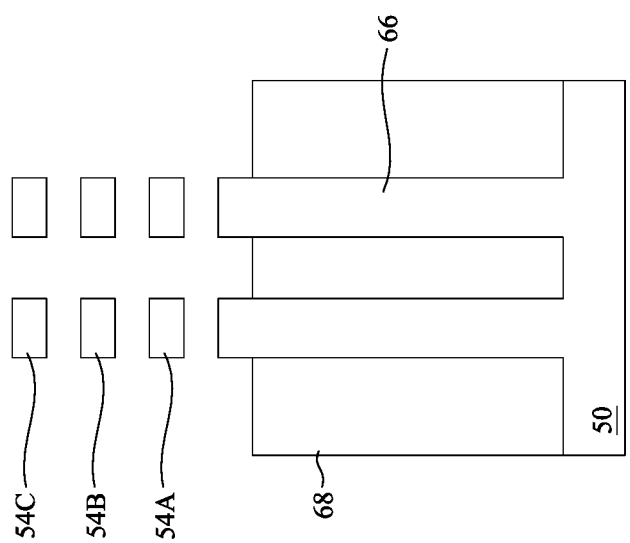
Figure 16C:
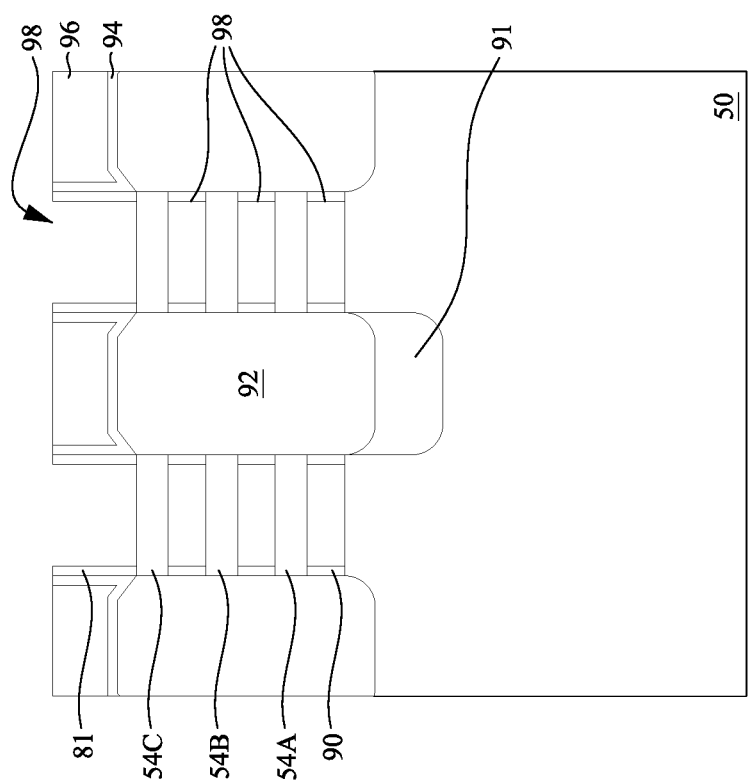

In FIGS. 16A through 16C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52.

Figure 17B:
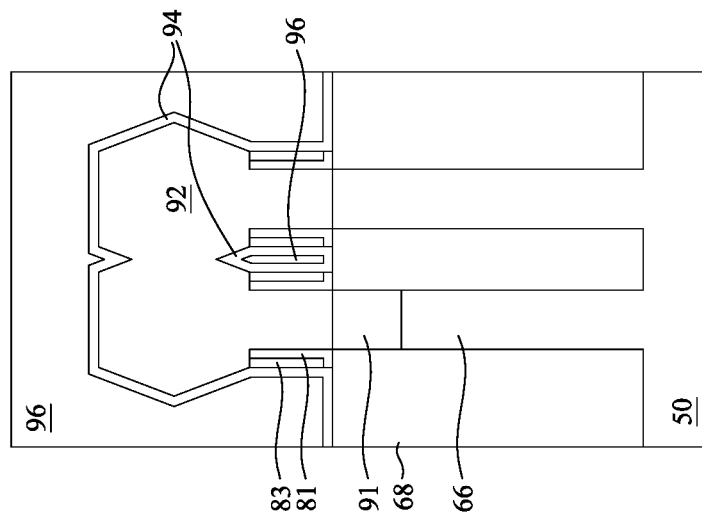
Figure 17A:
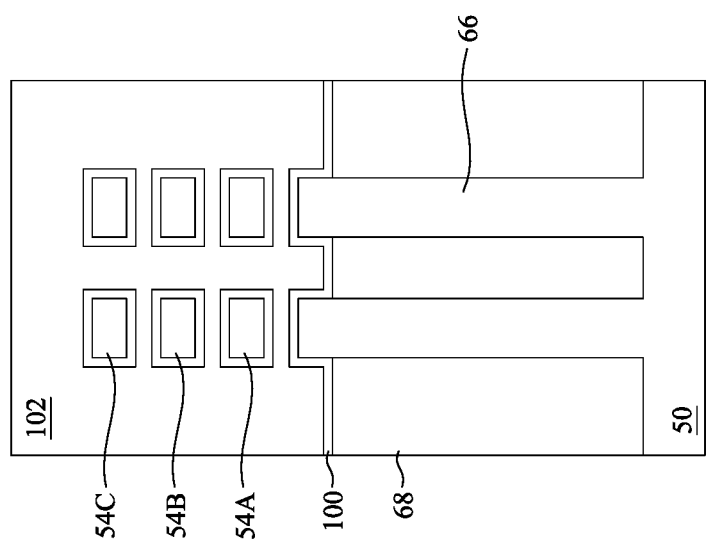
Figure 17C:
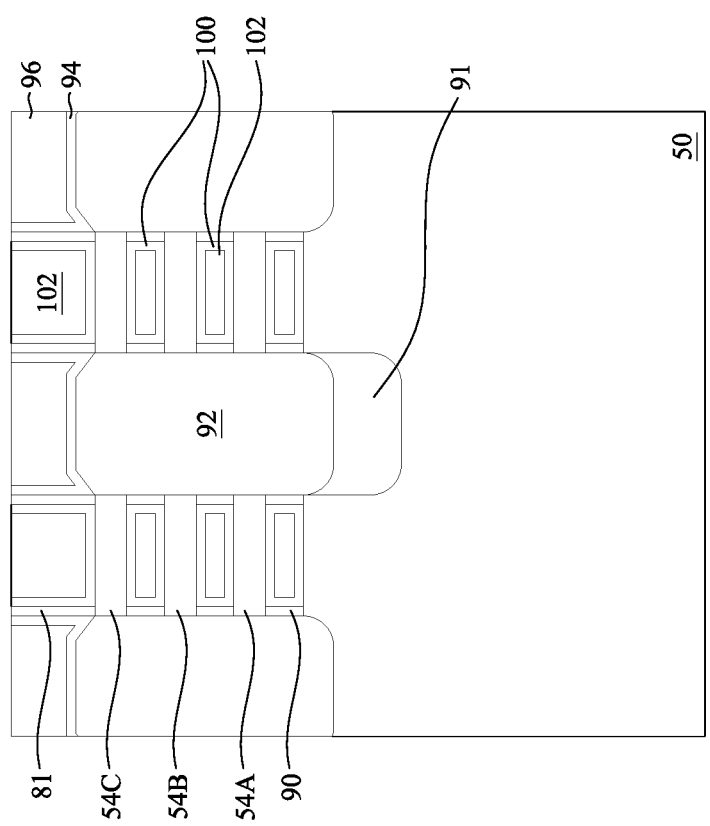

In FIGS. 17A through 17C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the first inner spacers 90.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18B:
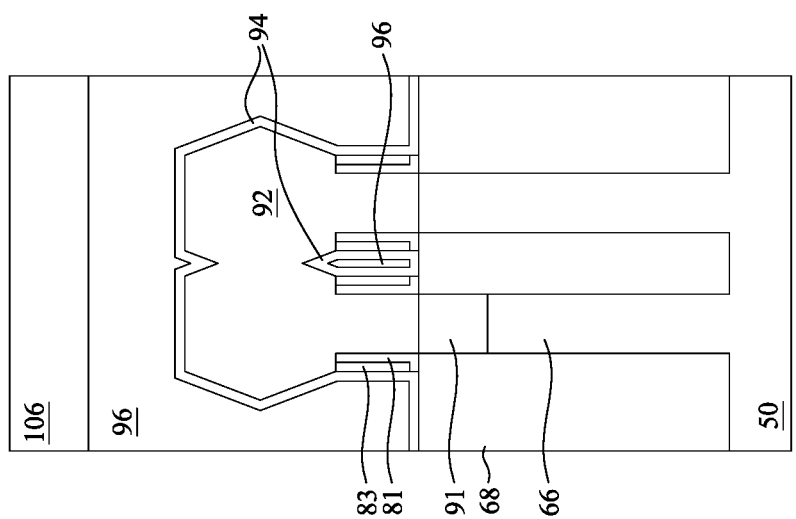
Figure 18A:
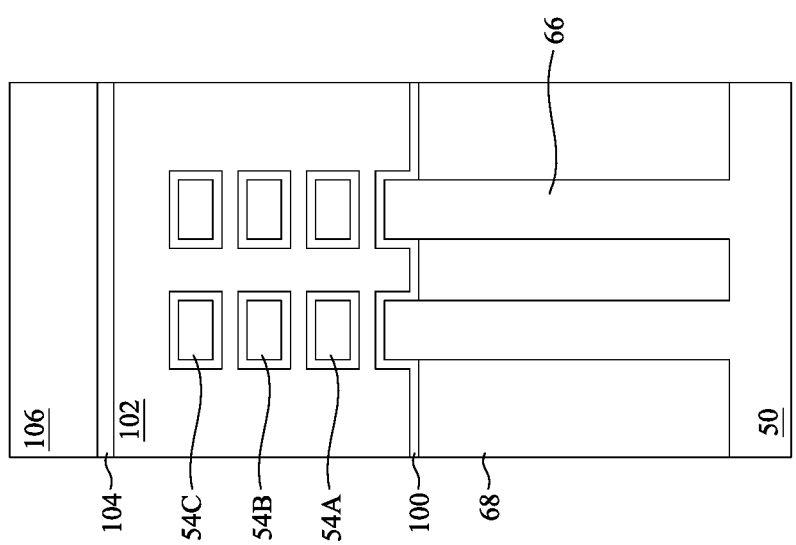
Figure 18C:
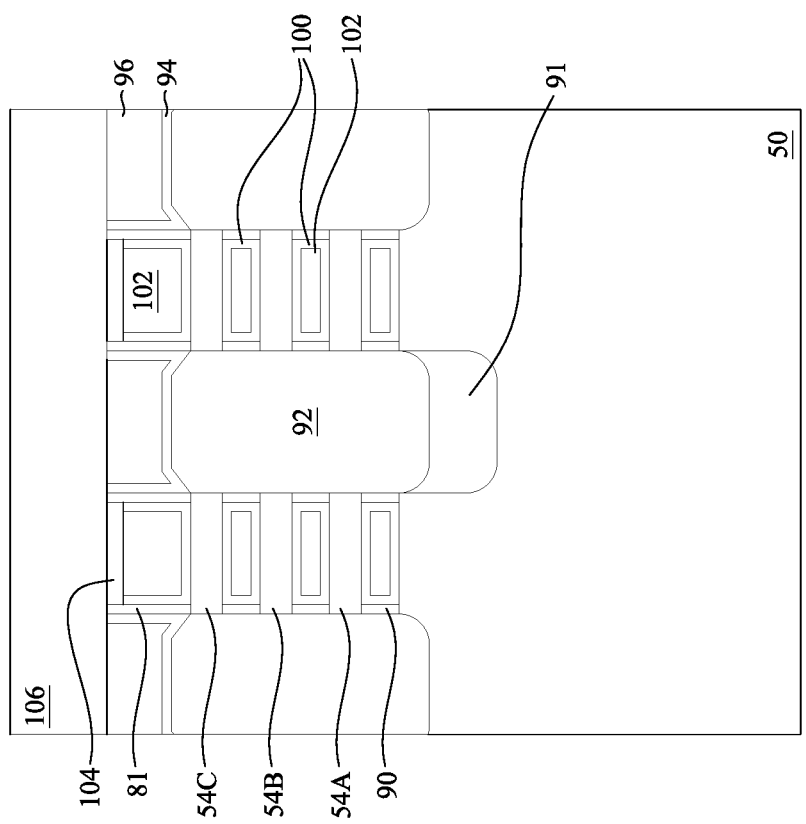

In FIGS. 18A through 18C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 20A through 20C) penetrate through the gate masks 104 to contact the top surfaces of the recessed gate electrodes 102.

As further illustrated by FIGS. 18A through 18C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
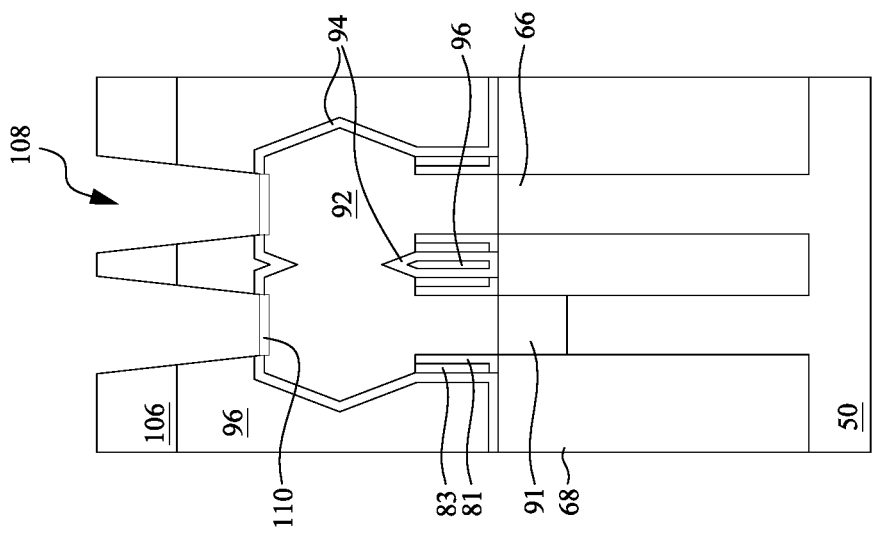
Figure 19A:
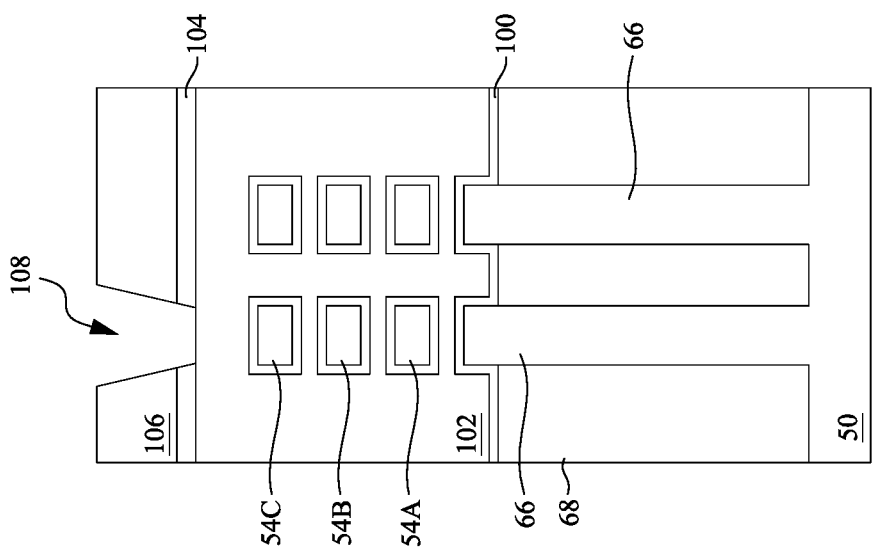
Figure 19C:
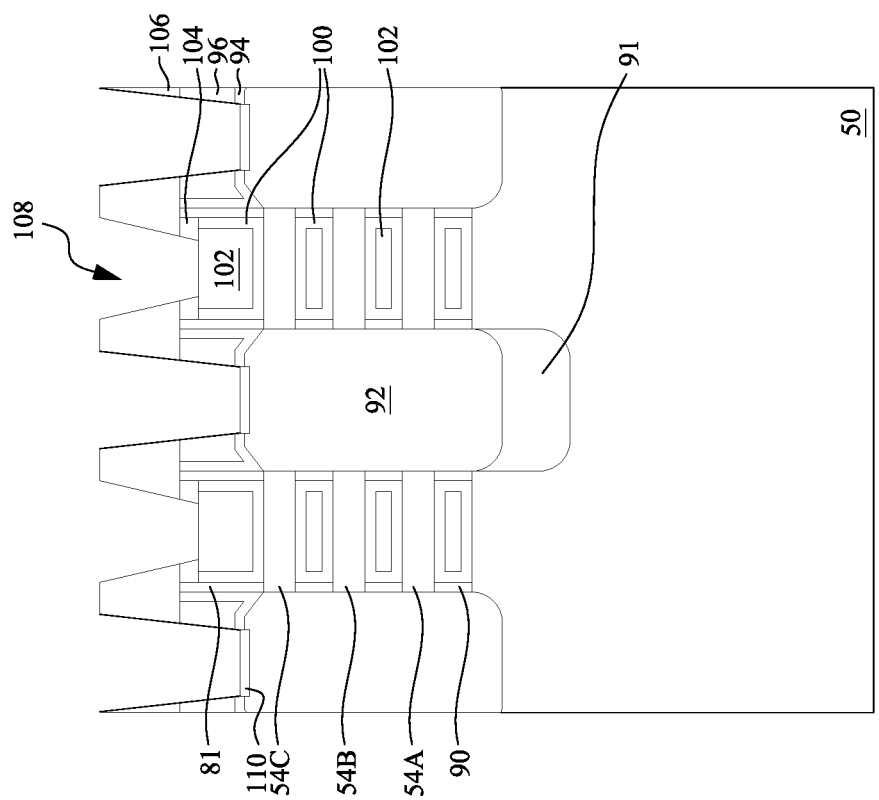

In FIGS. 19A through 19C, the second ILD 106, the first ILD 96, the CESL 94, and the gate masks 104 are etched to form fourth recesses 108 exposing surfaces of the epitaxial source/drain regions 92 and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the epitaxial source/drain regions 92 and/or the gate structures, and a bottom of the fourth recesses 108 may be level with (e.g., at a same level, or having a same distance from the substrate 50), or lower than (e.g., closer to the substrate 50) the epitaxial source/drain regions 92 and/or the gate structures. Although FIG. 19C illustrates the fourth recesses 108 as exposing the epitaxial source/drain regions 92 and the gate structures in a same cross-section, in various embodiments, the epitaxial source/drain regions 92 and the gate structures may be exposed in different cross-sections, thereby reducing the risk of shorting subsequently formed contacts.

After the fourth recesses 108 are formed, first silicide regions 110 are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide). In an embodiment, the first silicide regions 110 comprise TiSi and has a thickness in a range between about 2 nm and about 10 nm.

Figure 20B:
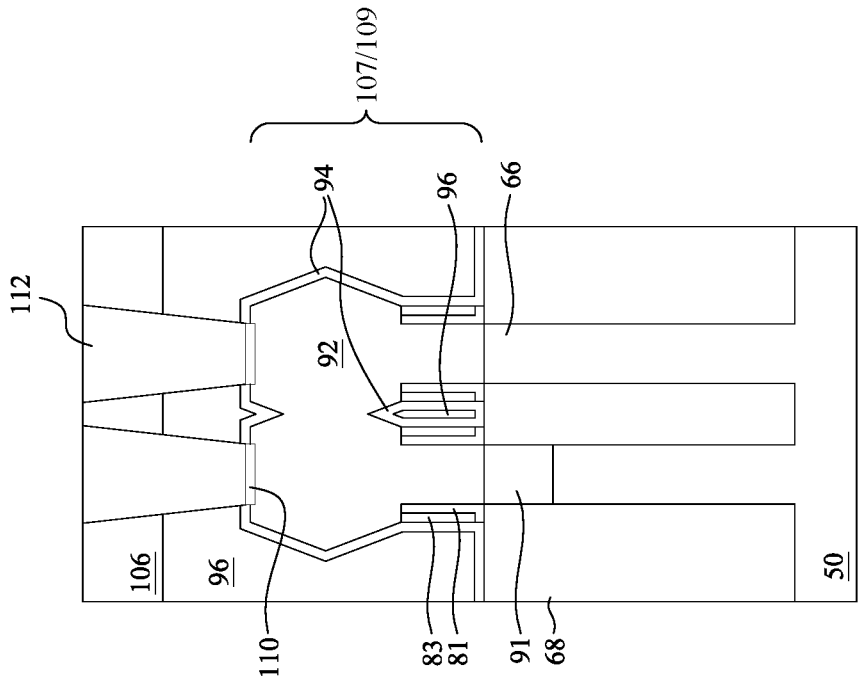
Figure 20A:
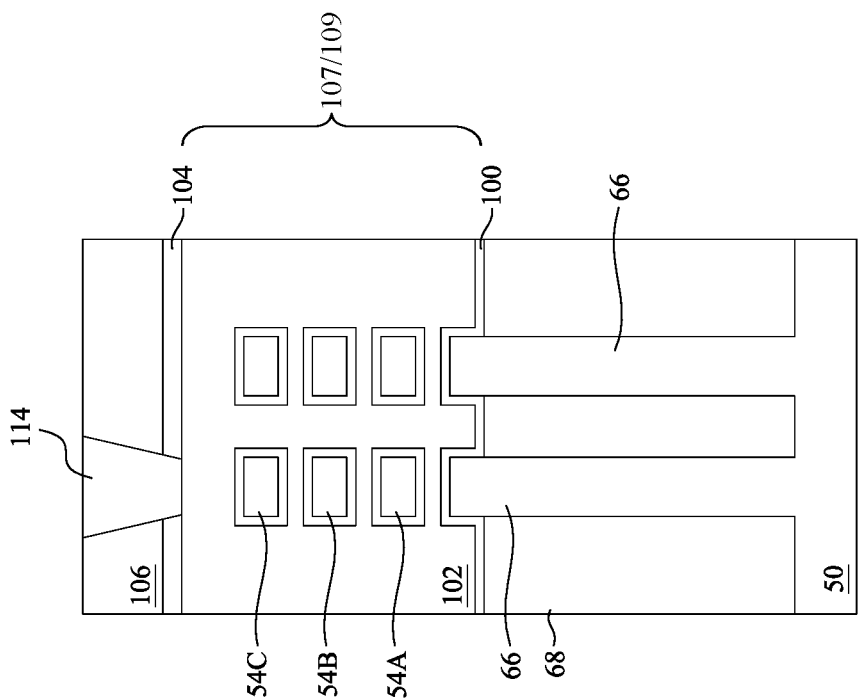
Figure 20C:
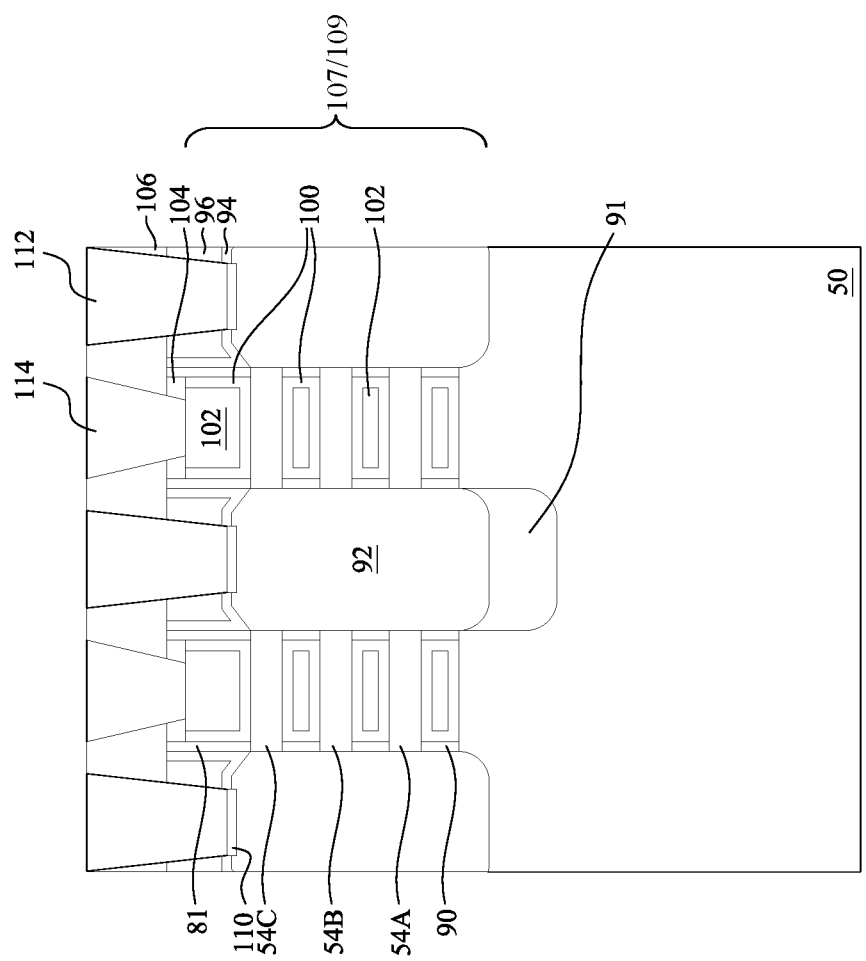

In FIGS. 20A through 20C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions 92, the second nanostructures 54, and the gate structures (including the gate dielectric layers 100 and the gate electrodes 102) may collectively be referred to as transistor structures 109. The transistor structures 109 may be formed in a device layer 107, with a first interconnect structure (such as the front-side interconnect structure 120, discussed below with respect to FIGS. 21A through 21C) being formed over a front-side thereof and a second interconnect structure (such as the backside interconnect structure 136, discussed below with respect to FIGS. 28A through 28I) being formed over a backside thereof. Although the device layer 107 is described as having nano-FETs, other embodiments may include a device layer 107 having different types of transistors (e.g., planar FETs, finFETs, thin film transistors (TFTs), or the like).

Although FIGS. 20A through 20C illustrate a source/drain contact 112 extending to each of the epitaxial source/drain regions 92, the source/drain contacts 112 may be omitted from certain ones of the epitaxial source/drain regions 92. For example, as explained in greater detail below, conductive features (e.g., backside vias or power rails) may be subsequently attached through a backside of one or more of the epitaxial source/drain regions 92. For these particular epitaxial source/drain regions 92, the source/drain contacts 112 may be omitted or may be dummy contacts that are not electrically connected to any overlying conductive lines (such as the first conductive features 122, discussed below with respect to FIGS. 21A through 21C).

FIGS. 21A through 29C illustrate intermediate steps of forming front-side interconnect structures and backside interconnect structures on the transistor structures 109. The front-side interconnect structures and the backside interconnect structures may each comprise conductive features that are electrically connected to the nano-FETs formed on the substrate 50. FIGS. 21A, 22A, 23A, 24A, 25A, 26A, 27A, 28A, and 29A illustrate reference cross-section A-A' illustrated in FIG. 1. FIGS. 21B, 22B, 23B, 24B, 25B, 26B, 27B, 28B, and 29B illustrate reference cross-section B-B' illustrated in FIG. 1. FIGS. 21C, 22C, 23C, 24C, 25C, 26C, 27C, 27D, 28C, 28E, 28F, 28G, 28I, and 29C illustrate reference cross-section C-C' illustrated in FIG. 1. The process steps described in FIGS. 21A through 29C may be applied to both the n-type region 50N and the p-type region 50P. As noted above, a back-side conductive feature (e.g., a backside via or a power rail) may be connected to one or more of the epitaxial source/drain regions 92. As such, the source/drain contacts 112 may be optionally omitted from the epitaxial source/drain regions 92.

Figure 21C:
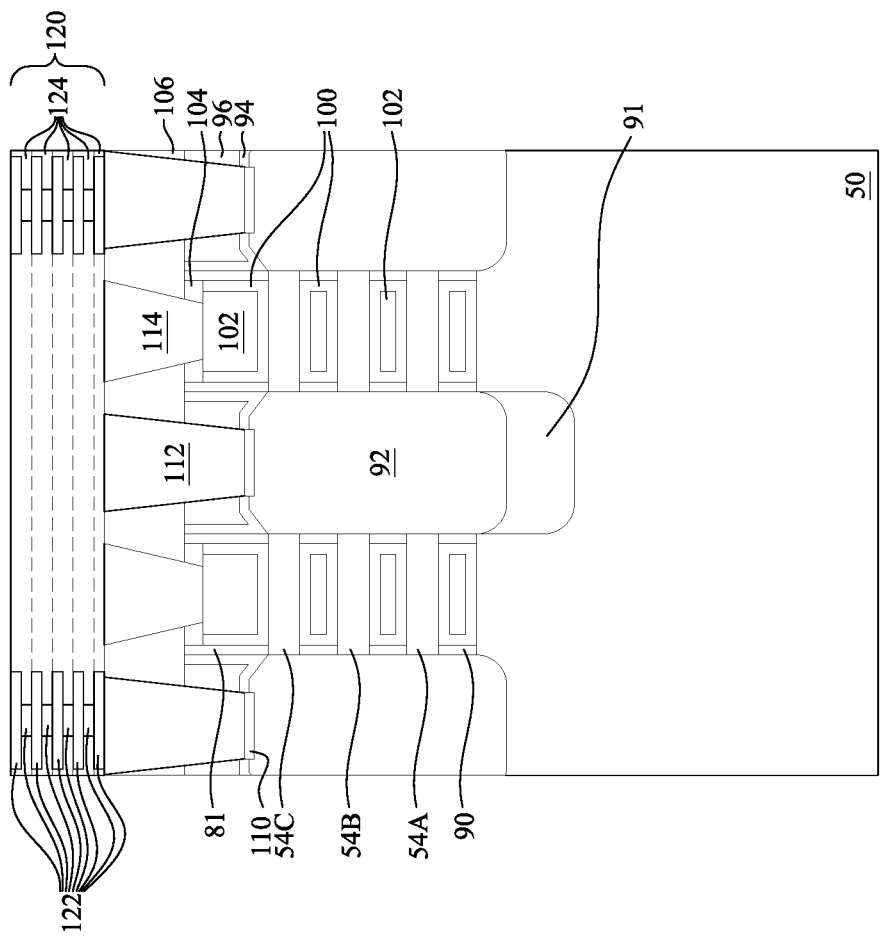

In FIGS. 21A through 21C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures 109 on which active devices are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 21A through 21C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 22B:
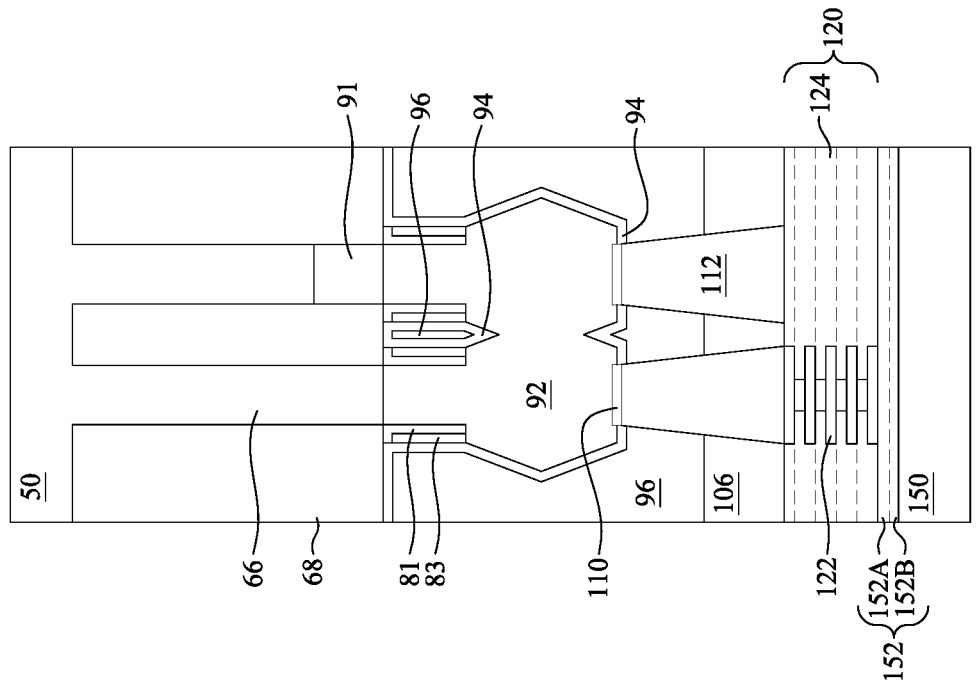
Figure 22A:
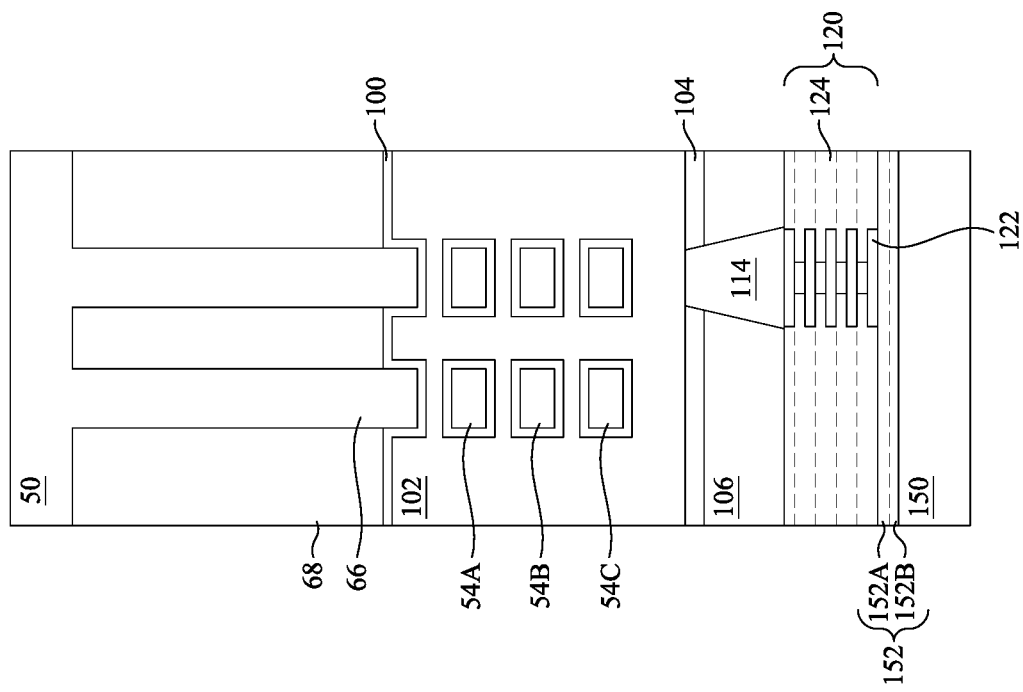
Figure 22C:
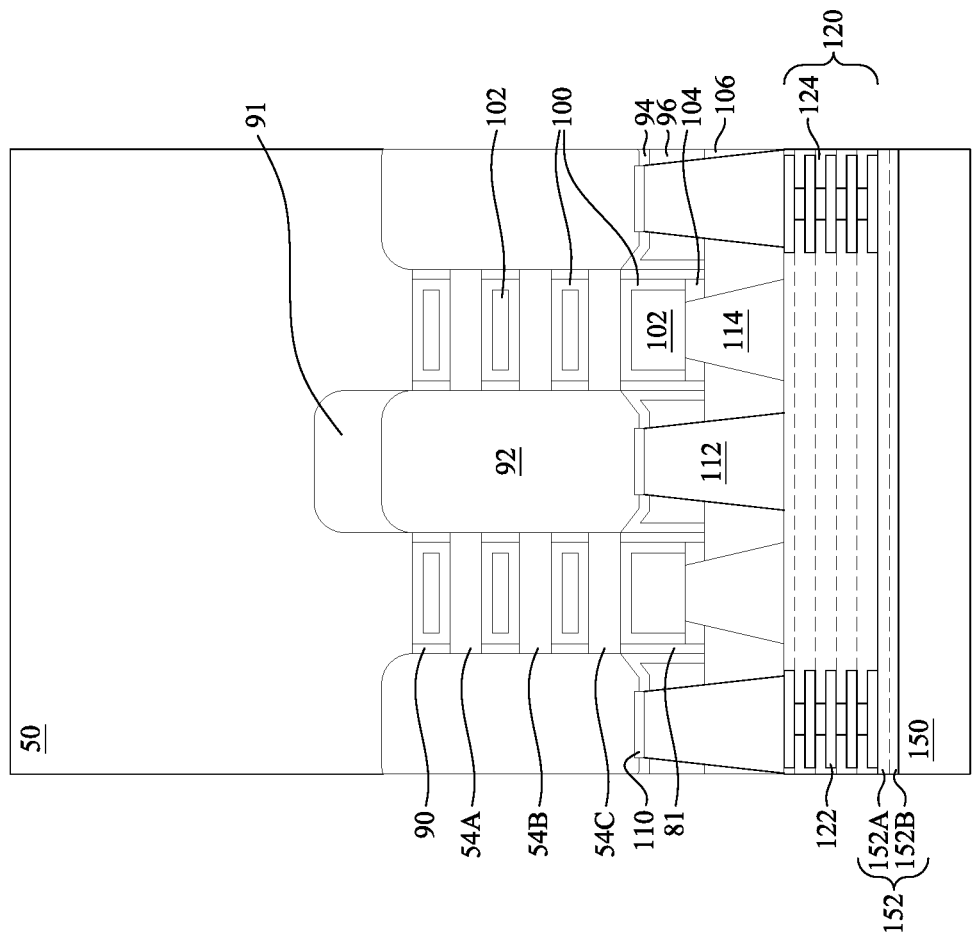

In FIGS. 22A through 22C, a carrier substrate 150 is bonded to a top surface of the front-side interconnect structure 120 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In various embodiments, the carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high density plasma (HDP) oxide, or the like) that is deposited by CVD, ALD, PVD, or the like. The second bonding layer 152B may likewise be an oxide layer that is formed on a surface of the carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 120 and the two are pressed against each other to initiate a pre-bonding of the carrier substrate 150 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 150 to a temperature of about 170° C.

Further in FIGS. 22A through 22C, after the carrier substrate 150 is bonded to the front-side interconnect structure 120, the device may be flipped such that a backside of the transistor structures 109 faces upwards. The backside of the transistor structures 109 may refer to a side opposite to the front-side of the transistor structures 109 on which the active devices are formed.

Figure 23B:
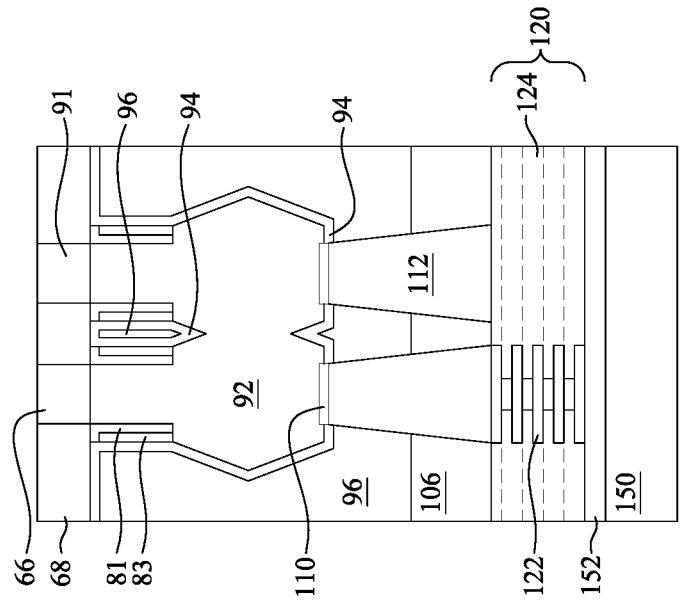
Figure 23A:
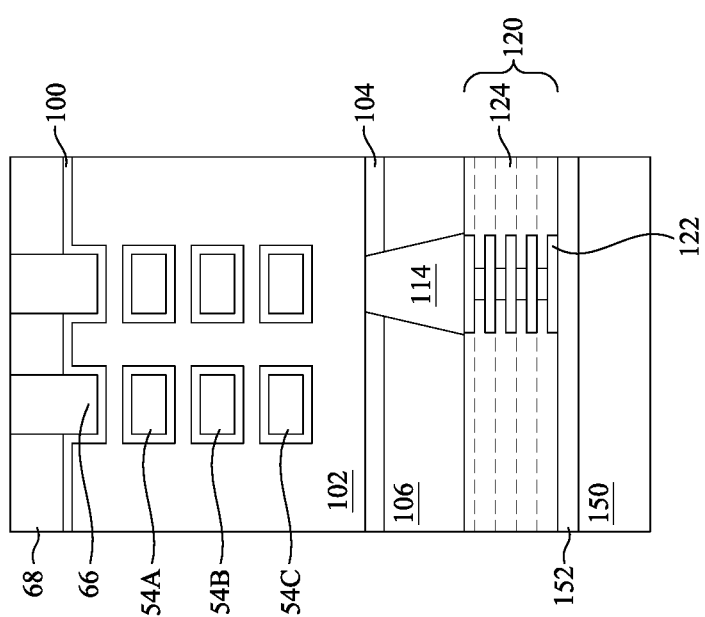
Figure 23C:
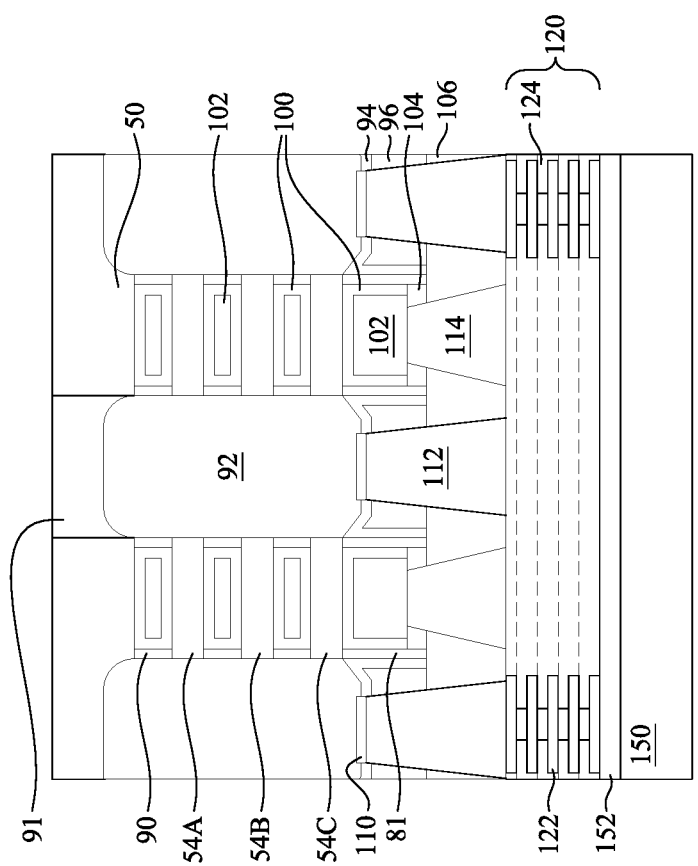

In FIGS. 23A through 23C, a thinning process may be applied to the backside of the substrate 50. The thinning process may comprise a planarization process (e.g., a mechanical grinding, a CMP, or the like), an etch-back process, a combination thereof, or the like. The thinning process may expose surfaces of the first epitaxial materials 91 opposite the front-side interconnect structure 120. Further, a portion of the substrate 50 may remain over the gate structures (e.g., the gate electrodes 102 and the gate dielectric layers 100) and the nanostructures 55 after the thinning process. As illustrated in FIGS. 23A through 23C, backside surfaces of the substrate 50, the first epitaxial materials 91, the STI regions 68, and the fins 66 may be level with one another following the thinning process.

Figure 24A:
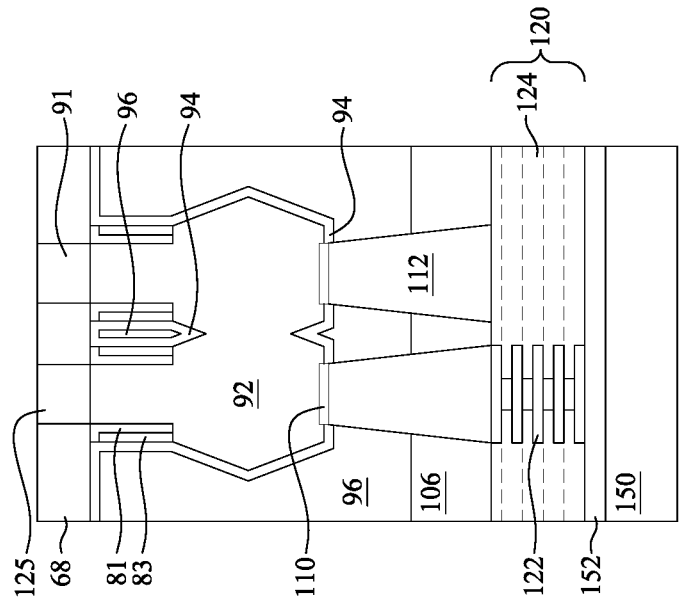
Figure 24B:
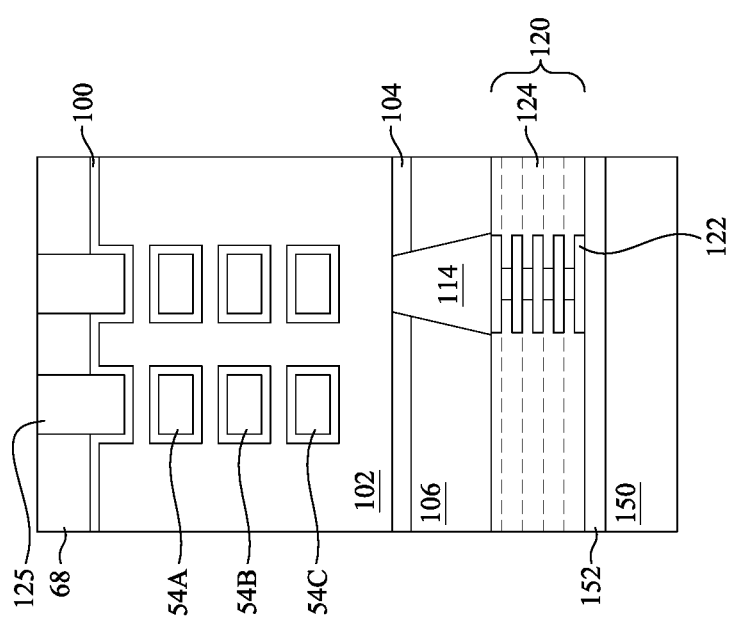
Figure 24C:
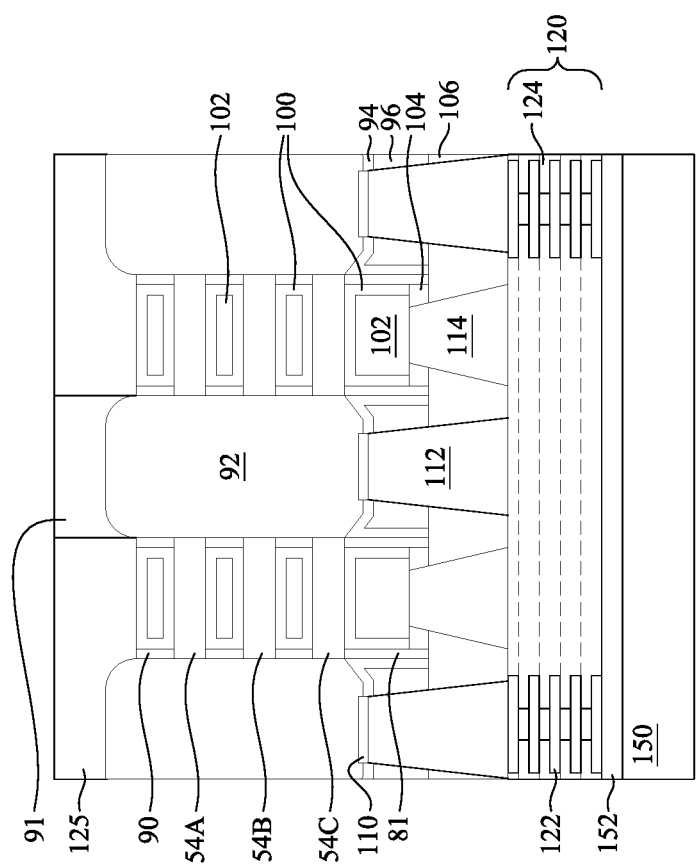

In FIGS. 24A through 24C, remaining portions of the fins 66 and the substrate 50 are removed and replaced with a second dielectric layer 125. The fins 66 and the substrate 50 may be etched using a suitable etching process, such as an isotropic etching process (e.g., a wet etching process), an anisotropic etching process (e.g., a dry etching process), or the like. The etching process may be one that is selective to the material of the fins 66 and the substrate 50 (e.g., etches the material of the fins 66 and the substrate 50 at a faster rate than the material of the STI regions 68, the gate dielectric layers 100, the epitaxial source/drain regions 92, and the first epitaxial materials 91). After etching the fins 66 and the substrate 50, surfaces of the STI regions 68, the gate dielectric layers 100, the epitaxial source/drain regions 92, and the first epitaxial materials 91 may be exposed.

The second dielectric layer 125 is then deposited on the backside of the transistor structures 109 in recesses formed by removing the fins 66 and the substrate 50. The second dielectric layer 125 may be deposited over the STI regions 68, the gate dielectric layers 100, and the epitaxial source/drain regions 92. The second dielectric layer 125 may physically contact surfaces of the STI regions 68, the gate dielectric layers 100, the epitaxial source/drain regions 92, and the first epitaxial materials 91. The second dielectric layer 125 may be substantially similar to the second ILD 106, described above with respect to FIGS. 18A through 18C. For example, the second dielectric layer 125 may be formed of a like material and using a like process as the second ILD 106. As illustrated in FIGS. 24A through 24C, a CMP process or the like may be used to remove material of the second dielectric layer 125 such that top surfaces of the second dielectric layer 125 are level with top surfaces of the STI regions 68 and the first epitaxial materials 91.

Figure 25C:
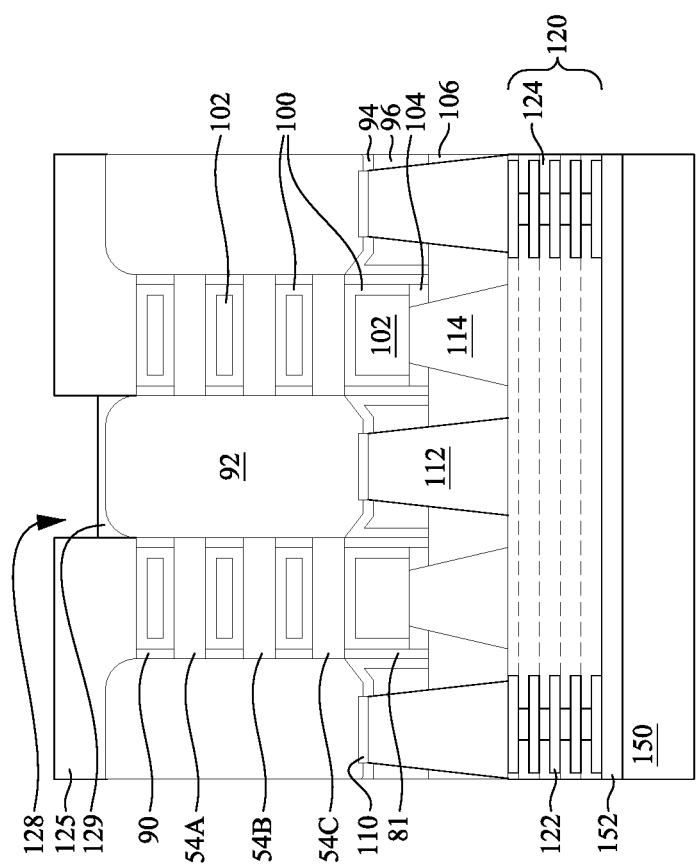

In FIGS. 25A through 25C, the first epitaxial materials 91 are removed to form fifth recesses 128 and second silicide regions 129 are formed in the fifth recesses 128. The first epitaxial materials 91 may be removed by a suitable etching process, which may be an isotropic etching process, such as a wet etching process. The etching process may have a high etch selectivity to materials of the first epitaxial materials 91. As such, the first epitaxial materials 91 may be removed without significantly removing materials of the second dielectric layer 125, the STI regions 68, or the epitaxial source/drain regions 92. The fifth recesses 128 may expose sidewalls of the STI regions 68, backside surfaces of the epitaxial source/drain regions 92, and sidewalls of the second dielectric layer 125.

Second silicide regions 129 may then be formed in the fifth recesses 128 on backsides of the epitaxial source/drain regions 92. The second silicide regions 129 may be similar to the first silicide regions 110, described above with respect to FIGS. 19A through 19C. For example, the second silicide regions 129 may be formed of a like material and using a like process as the first silicide regions 110.

Figure 26C:
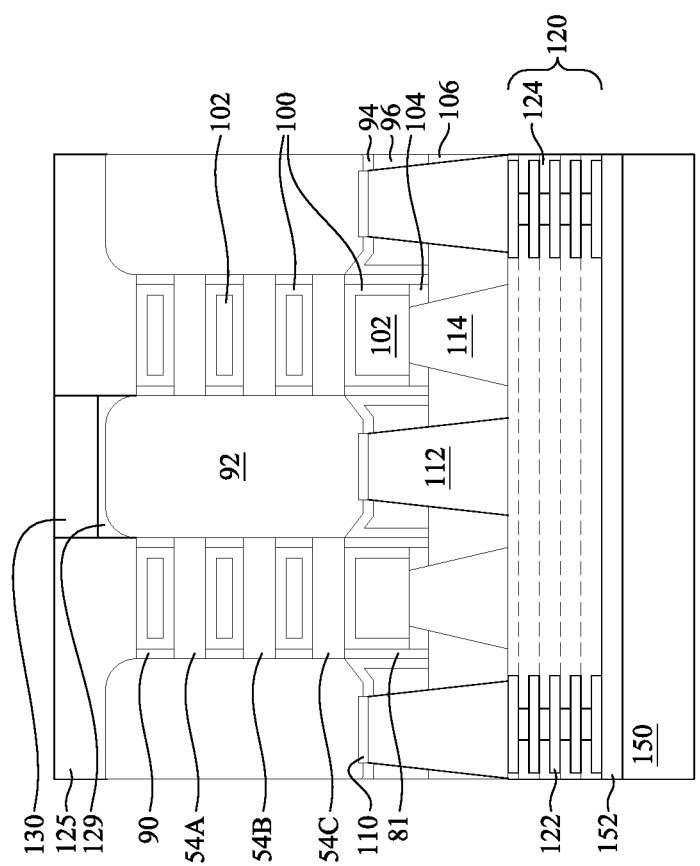

In FIGS. 26A through 26C, backside vias 130 are formed in the fifth recesses 128. The backside vias 130 may extend through the second dielectric layer 125 and the STI regions 68 and may be electrically coupled to the epitaxial source/drain regions 92 through the second silicide regions 129. The backside vias 130 may be similar to the source/drain contacts 112, described above with respect to FIGS. 20A through 20C. For example, the backside vias 130 may be formed of a like material and using a like process as the source/drain contacts 112.

In FIGS. 27A through 27D, conductive lines 134 and a third dielectric layer 132 are formed over the second dielectric layer 125, the STI regions 68, and the backside vias 130. The third dielectric layer 132 may be similar to the second dielectric layer 125. For example, third dielectric layer 132 may be formed of a like material and using a like process as the second dielectric layer 125.

The conductive lines 134 are formed in the third dielectric layer 132. Forming the conductive lines 134 may include patterning recesses in the third dielectric layer 132 using a combination of photolithography and etching processes, for example. A pattern of the recesses in the third dielectric layer 132 may correspond to a pattern of the conductive lines 134. The conductive lines 134 are then formed by depositing a conductive material in the recesses. In some embodiments, the conductive lines 134 comprise a metal layer, which may be a single layer or a composite layer comprising a plurality of sub-layers formed of different materials. In some embodiments, the conductive lines 134 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The conductive lines 134 may be formed using, for example, CVD, ALD, PVD, plating or the like. The conductive lines 134 are physically and electrically coupled to the epitaxial source/drain regions 92 through the backside vias 130 and the second silicide regions 129. A planarization process (e.g., a CMP, a grinding, an etch-back, or the like) may be performed to remove excess portions of the conductive lines 134 formed over the third dielectric layer 132.

In some embodiments, the conductive lines 134 are power rails, which are conductive lines that electrically connect the epitaxial source/drain regions 92 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the conductive lines 134 may be at least twice a width of first level conductive lines (e.g., first conductive features 122) of the front-side interconnect structure 120.

Figure 27B:
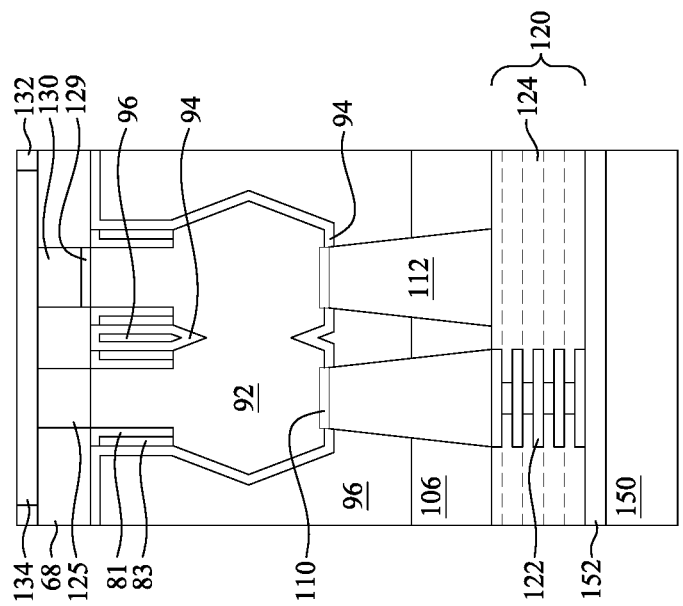
Figure 27A:
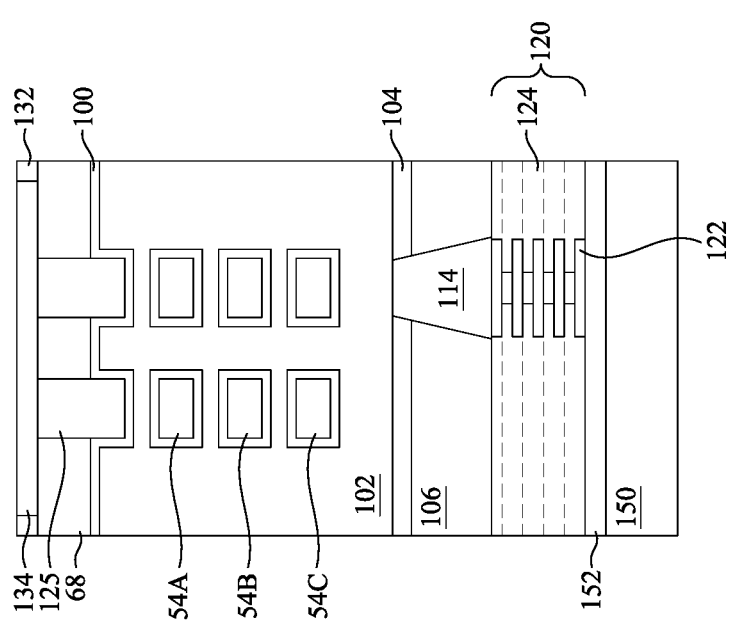
Figure 27C:
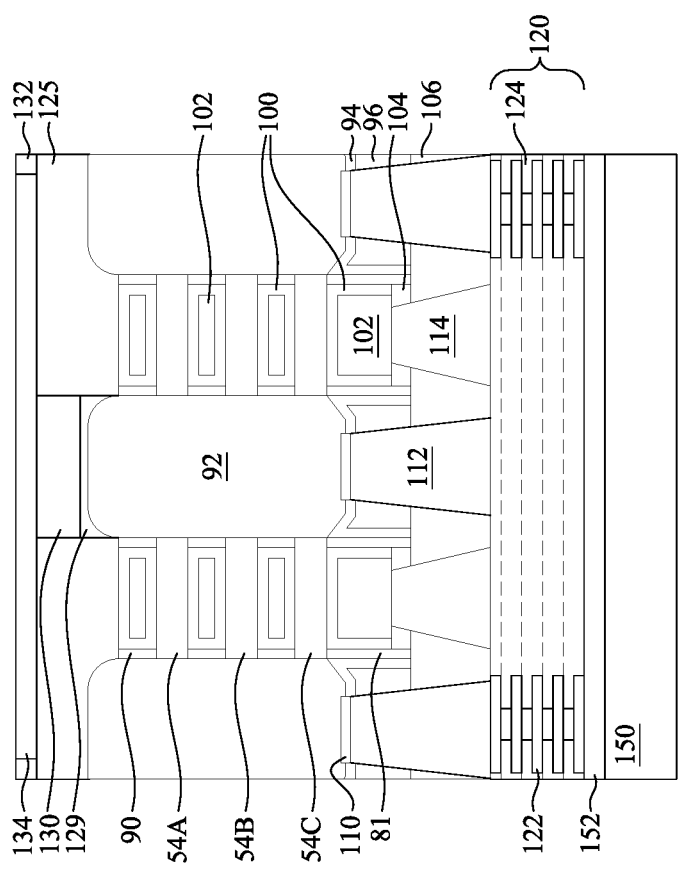
Figure 27D:
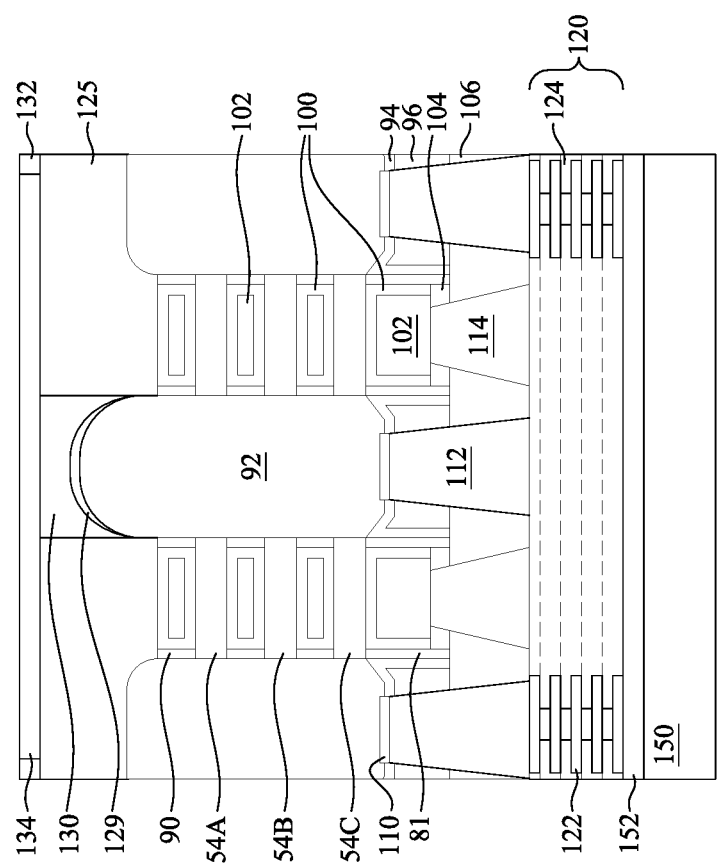

FIG. 27D illustrates an embodiment in which the epitaxial source/drain regions 92 to which the backside vias 130 are electrically coupled have heights greater than the epitaxial source/drain regions 92 which are not electrically coupled to the backside vias 130. The heights of the epitaxial source/drain regions 92 may be selected by controlling depths of the first recesses 86 and the second recesses 87 and/or controlling the thickness of the first epitaxial materials 91. In some embodiments, ratio of a height of the epitaxial source/drain regions 92 which are not electrically coupled to the backside vias 130 to a height of the epitaxial source/drain regions 92 which are electrically coupled to the backside vias 130 may be from about 10 nm to about 50 nm. Forming the epitaxial source/drain regions 92 which are not electrically coupled to the backside vias 130 with heights less than the epitaxial source/drain regions 92 which are electrically coupled to the backside vias 130 results in the epitaxial source/drain regions 92 which are not electrically coupled to the backside vias 130 being separated from the conductive lines 134 by a greater thickness of the second dielectric layer 125. This provides better isolation of the epitaxial source/drain regions 92 which are not electrically coupled to the backside vias 130 from the conductive lines 134 and improves device performance.

In FIGS. 28A through 28I, remaining portions of a backside interconnect structure 136 are formed over the third dielectric layer 132 and the conductive lines 134. The backside interconnect structure 136 may be referred to as a backside interconnect structure because it is formed on a backside of the transistor structures 109 (e.g., a side of the transistor structures 109 opposite the side of the transistor structure 109 on which active devices are formed). The backside interconnect structure 136 may comprise the second dielectric layer 125, the third dielectric layer 132, the backside vias 130, and the conductive lines 134. The backside interconnect structure 136 may further comprise conductive lines 140A-140C (collectively referred to as conductive lines 140) and conductive vias 139A-139C (collectively referred to as conductive vias 139) formed in fourth dielectric layers 138A-138F (collectively referred to as fourth dielectric layers 138). The conductive vias 139 may extend through respective ones of the fourth dielectric layers 138 to provide vertical connections between layers of the conductive lines 140.

A power supply voltage $V_{DD}$ (which may be a positive power supply voltage) and a power supply voltage $V_{SS}$ (which may be an electrical ground or a negative power supply voltage) may be routed through the conductive lines 140 and decoupling capacitors 142 may be formed in the backside interconnect structure 136. The fourth dielectric layers 138 may comprise dielectric materials, such as high-k dielectric materials (labeled as reference numeral 141 in FIGS. 28C through 28G), low-k dielectric materials, extra low-k (ELK) dielectric materials, or the like. The fourth dielectric layers 138 may be deposited using an appropriate process, such as, CVD, ALD, PVD, PECVD, or the like. The high-k dielectric materials 141 may have k-values ranging from about 2.6 to about 40 or greater than about 7.0 and may include metal oxides or silicates of hafnium, aluminum, zirconium, lanthanum, manganese, barium, titanium, lead, and combinations thereof. In some embodiments, the fourth dielectric layers 138 adjacent to conductive lines 140 which are routed for the power supply voltage $V_{DD}$ and the power supply voltage $V_{SS}$ may be formed of the high-k dielectric materials 141, while a remainder of the fourth dielectric layers 138 may be formed of low-k dielectric materials, ELK dielectric materials, or the like. Using the high-k dielectric materials 141 having the prescribed k-values for the fourth dielectric layers 138 adjacent the conductive lines 140 which are routed for the power supply voltage $V_{DD}$ and the power supply voltage $V_{SS}$ allows for the decoupling capacitors 142 to be formed with greater capacitance and less area. In some embodiments, the third dielectric layer 132, the STI regions 68, and/or the second dielectric layer 125 may be formed of the high-k dielectric materials 141.

FIGS. 28C through 28G illustrate various configurations of the backside interconnect structure 136 in accordance with some embodiments. In the embodiment illustrated in FIG. 28C, the conductive lines 140A are routed for the power supply voltage $V_{DD}$ and the power supply voltage $V_{SS}$, the fourth dielectric layer 138B is formed of the high-k dielectric materials 141, and the fourth dielectric layers 138A and 138C-138F are formed of the low-k dielectric materials. As such, the decoupling capacitors 142 are formed horizontally in the layer including the conductive lines 140A and the fourth dielectric layer 138B formed of the high-k dielectric materials 141. The power supply voltage $V_{DD}$ and the power supply voltage $V_{SS}$ may be routed in any of the conductive lines 140A-140C or the conductive lines 134 and the corresponding fourth dielectric layers 138B, 138D, 138F, or the third dielectric layer 132, respectively, may be formed of the high-k dielectric materials 141 to form the horizontal decoupling capacitors 142. In various embodiments including the horizontal decoupling capacitors 142, the power supply voltage $V_{DD}$ and the power supply voltage $V_{SS}$ may be separated from one another within the conductive lines 140A-140C or the conductive lines 134 by a distance ranging from about 10 nm to about 400 nm.

Figure 28B:
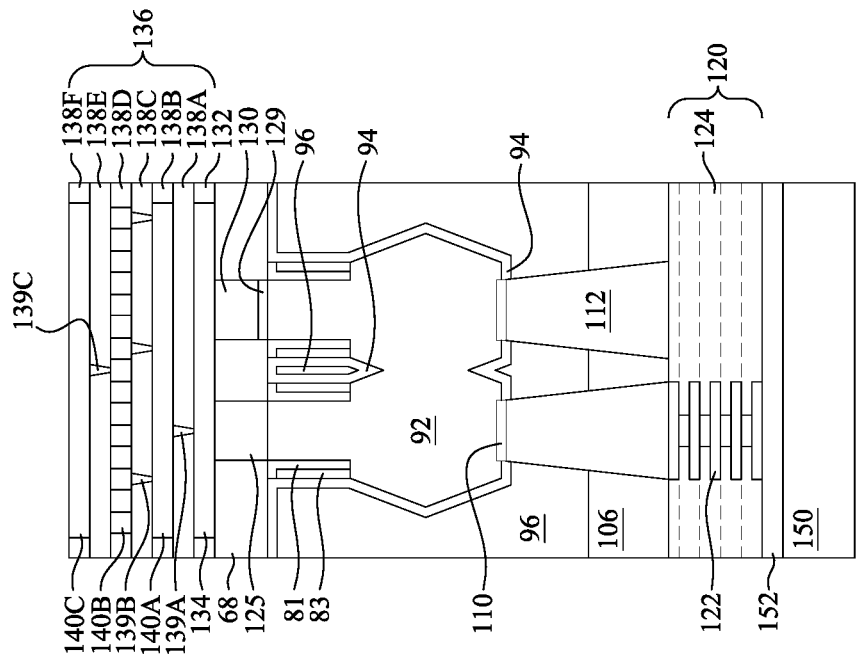
Figure 28A:
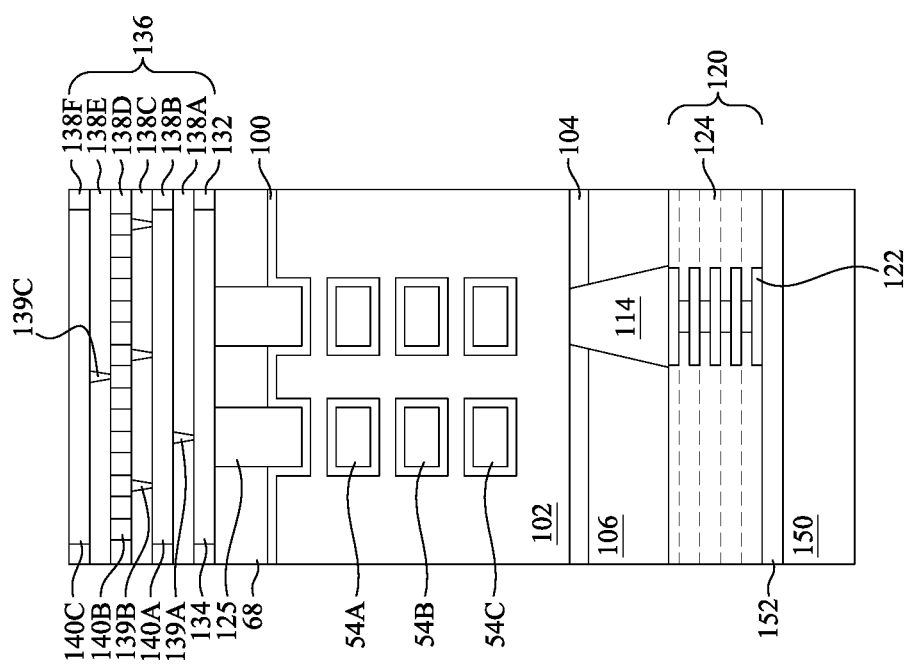
Figure 28C:
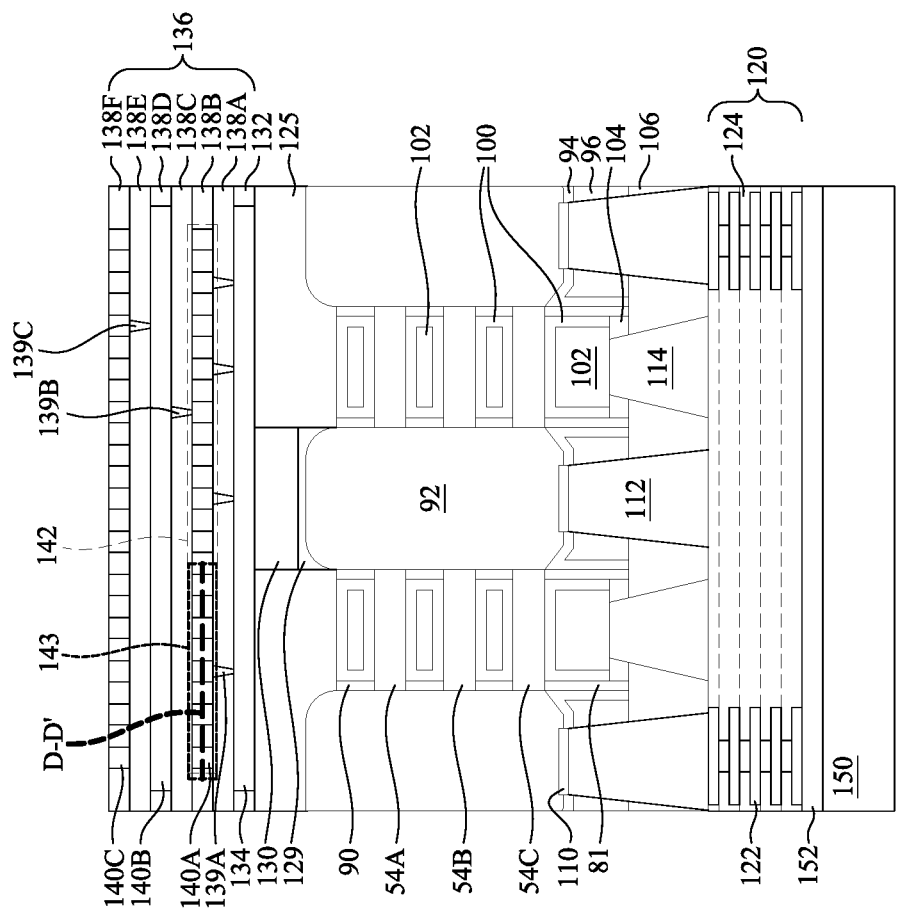
Figure 28D:
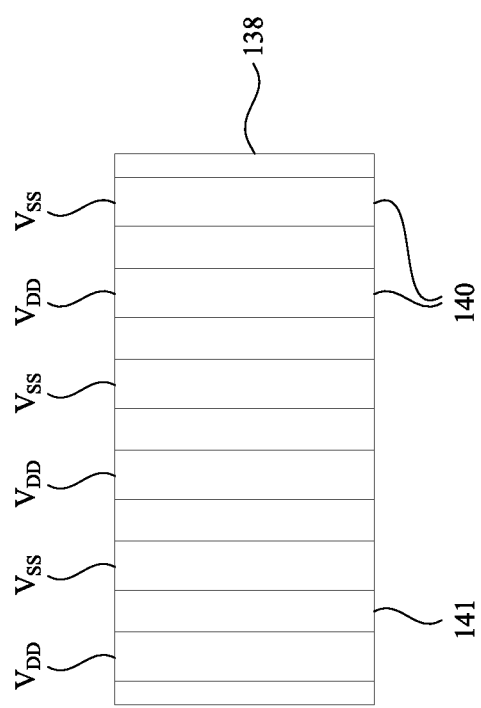

FIG. 28D illustrates a detailed view cross-sectional view of region 143 of FIG. 28C along reference cross-section D-D', illustrated in FIG. 28C. As illustrated in FIG. 28D, in an embodiment in which the power supply voltage $V_{DD}$ and the power supply voltage $V_{SS}$ are routed in the conductive lines 140A, the conductive lines 140A include alternating lines routed for the power supply voltage $V_{DD}$ and the power supply voltage $V_{SS}$. As discussed previously, the fourth dielectric layer 138B may be formed of the high-k dielectric material 141.

Figure 28E:
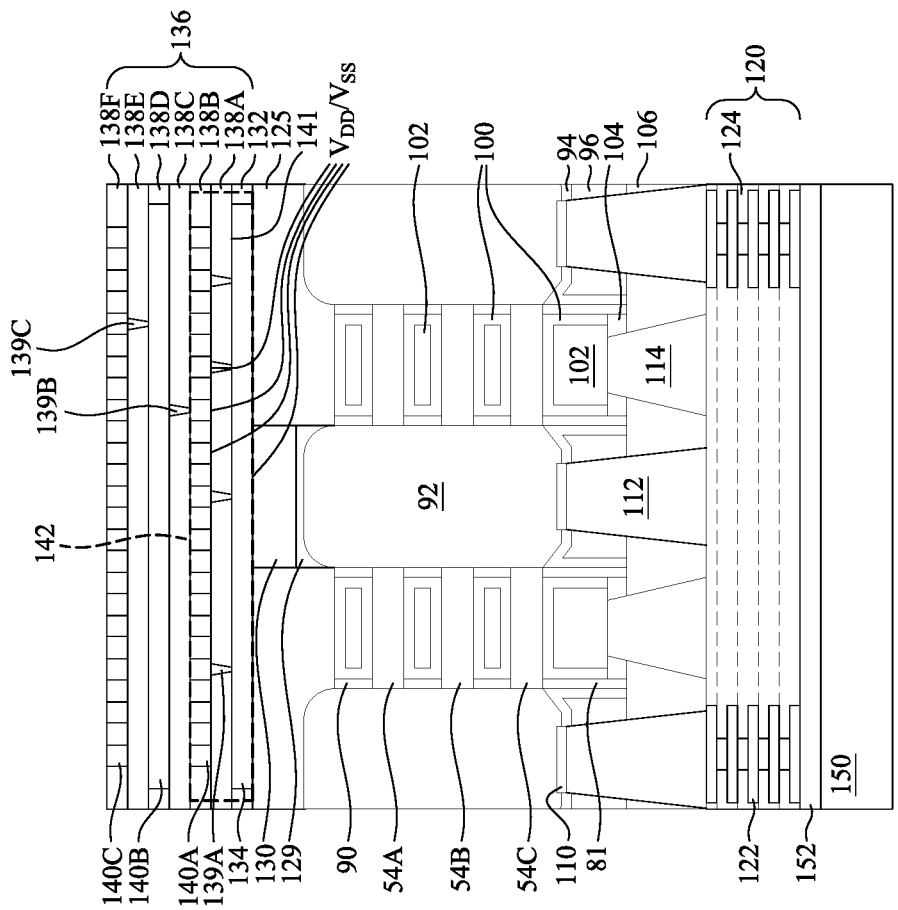

In the embodiment illustrated in FIG. 28E, the conductive lines 134 are routed for the power supply voltage $V_{DD}$ or the power supply voltage $V_{SS}$, the conductive lines 140A are routed for the other of the power supply voltage $V_{DD}$ or the power supply voltage $V_{SS}$, the fourth dielectric layer 138A is formed of the high-k dielectric materials 141, and the fourth dielectric layers 138B-138F are formed of the low-k dielectric materials. As such, the decoupling capacitors 142 are formed vertically in the conductive lines 134, the conductive lines 140A, and the fourth dielectric layer 138A.

Figure 28F:
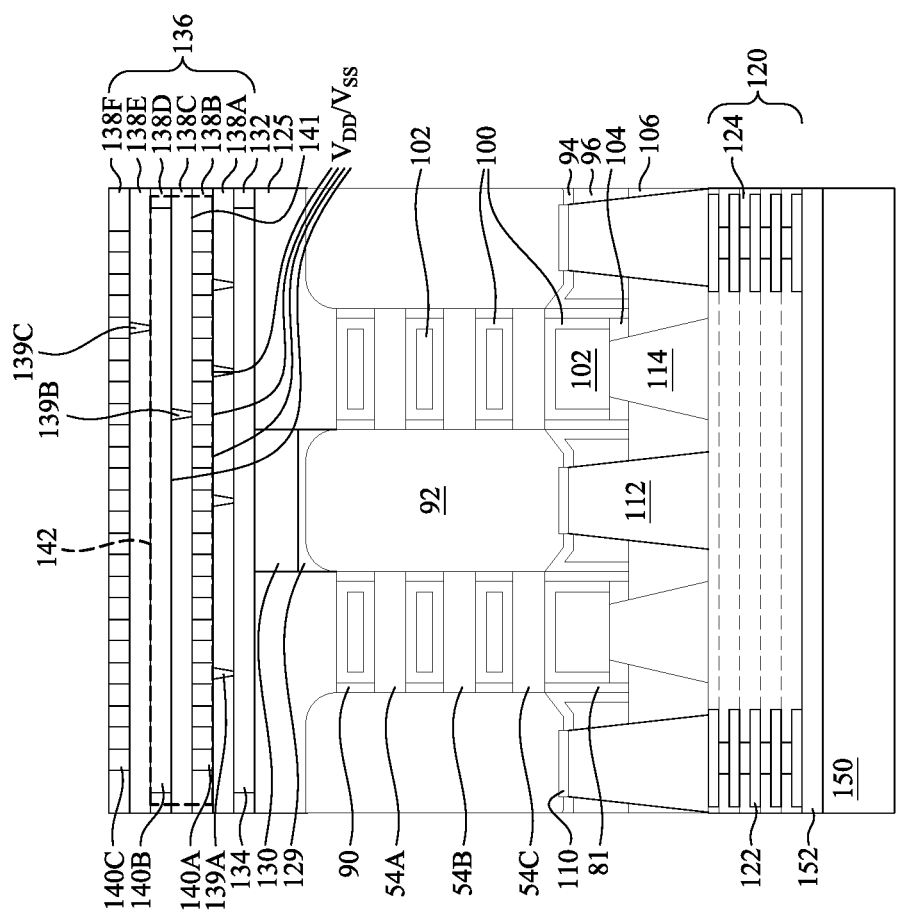

In the embodiment illustrated in FIG. 28F, the conductive lines 140A are routed for the power supply voltage $V_{DD}$ or the power supply voltage $V_{SS}$, the conductive lines 140B are routed for the other of the power supply voltage $V_{DD}$ or the power supply voltage $V_{SS}$, the fourth dielectric layer 138C is formed of the high-k dielectric materials 141, and the fourth dielectric layers 138A, 138B and 138D-138F are formed of the low-k dielectric materials. As such, the decoupling capacitors 142 are formed vertically in the conductive lines 140A, the conductive lines 140B, and the fourth dielectric layer 138C.

Figure 28G:
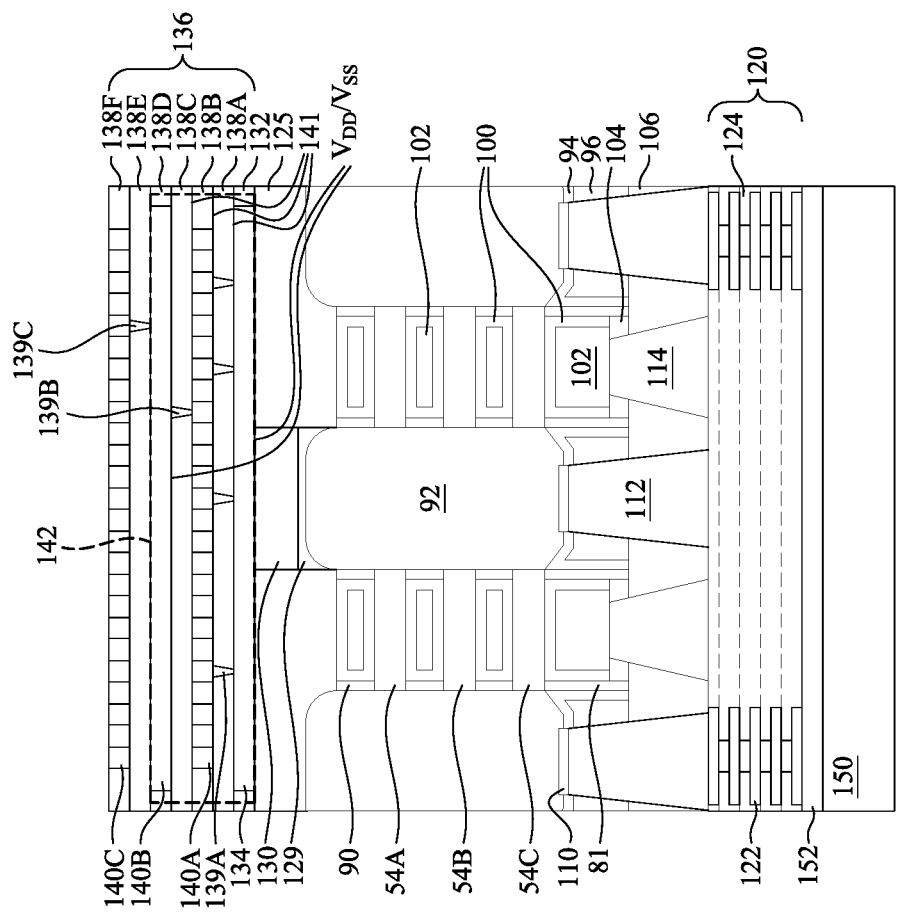

In the embodiment illustrated in FIG. 28G, the conductive lines 134 are routed for the power supply voltage $V_{DD}$ or the power supply voltage $V_{SS}$, the conductive lines 140B are routed for the other of the power supply voltage $V_{DD}$ or the power supply voltage $V_{SS}$, the fourth dielectric layers 138A-138C are formed of the high-k dielectric materials 141, and the fourth dielectric layers 138D-138F are formed of the low-k dielectric materials. As such, the decoupling capacitors 142 are formed vertically in the conductive lines 134, the conductive lines 140B, and the fourth dielectric layers 138C-138F. The power supply voltage $V_{DD}$ and the power supply voltage $V_{SS}$ may be routed in any of the conductive lines 140A-140C or the conductive lines 134 and the corresponding fourth dielectric layers 138A-138E between the power supply voltage VDD and the power supply voltage $V_{SS}$ may be formed of the high-k dielectric materials 141 to form the vertical decoupling capacitors 142. In various embodiments including the vertical decoupling capacitors, fourth dielectric layers 138A-138E between the power supply voltage VDD and the power supply voltage $V_{SS}$ may have thicknesses ranging from about 10 nm to about 100 nm.

The conductive vias 139 and the conductive lines 140 may be formed through any acceptable process, such as, a damascene process, a dual damascene process, or the like. In some embodiments, the conductive vias 139 and the conductive lines 140 may be formed using damascenes processes in which a respective fourth dielectric layer 138 is patterned utilizing a combination of photolithography and etching techniques to form trenches corresponding to the desired pattern of the conductive vias 139 and/or the conductive lines 140. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the conductive vias 139 and the conductive lines 140 may be formed by depositing a seed layer of copper or a copper alloy, and filling the trenches by electroplating. A chemical mechanical planarization (CMP) process or the like may be used to remove excess conductive material from a surface of the respective fourth dielectric layer 138 and to planarize surfaces of the fourth dielectric layer 138 and the conductive vias 139 and/or the conductive lines 140 for subsequent processing.

FIGS. 28A through 28I illustrate three layers of the conductive vias 139, three layers of the conductive lines 140, and six layers of the fourth dielectric layers 138 in the backside interconnect structure 136. However, it should be appreciated that the backside interconnect structure 136 may comprise any number of conductive vias 139 and conductive lines 140 disposed in any number of fourth dielectric layers 138. The backside interconnect structure 136 may be electrically connected to the conductive lines 134 (e.g., power rails) to provide circuits (e.g., power circuits) on the backside of the nano-FETs.

Figure 28H:
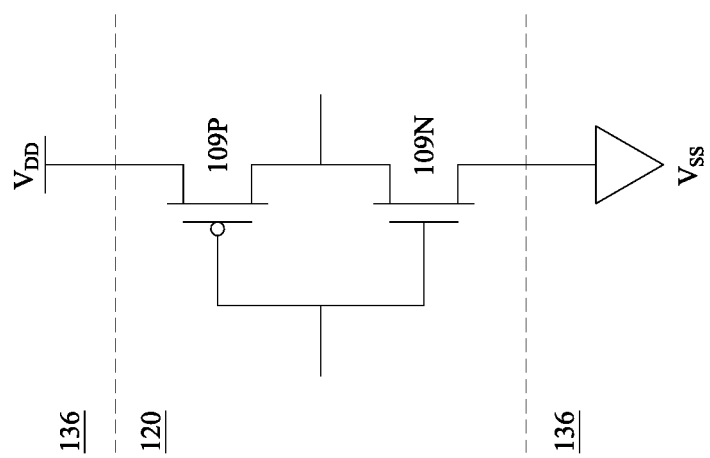
FIG. 28H is a circuit layout of nano-FETs, in accordance with some embodiments.
Figure 28I:
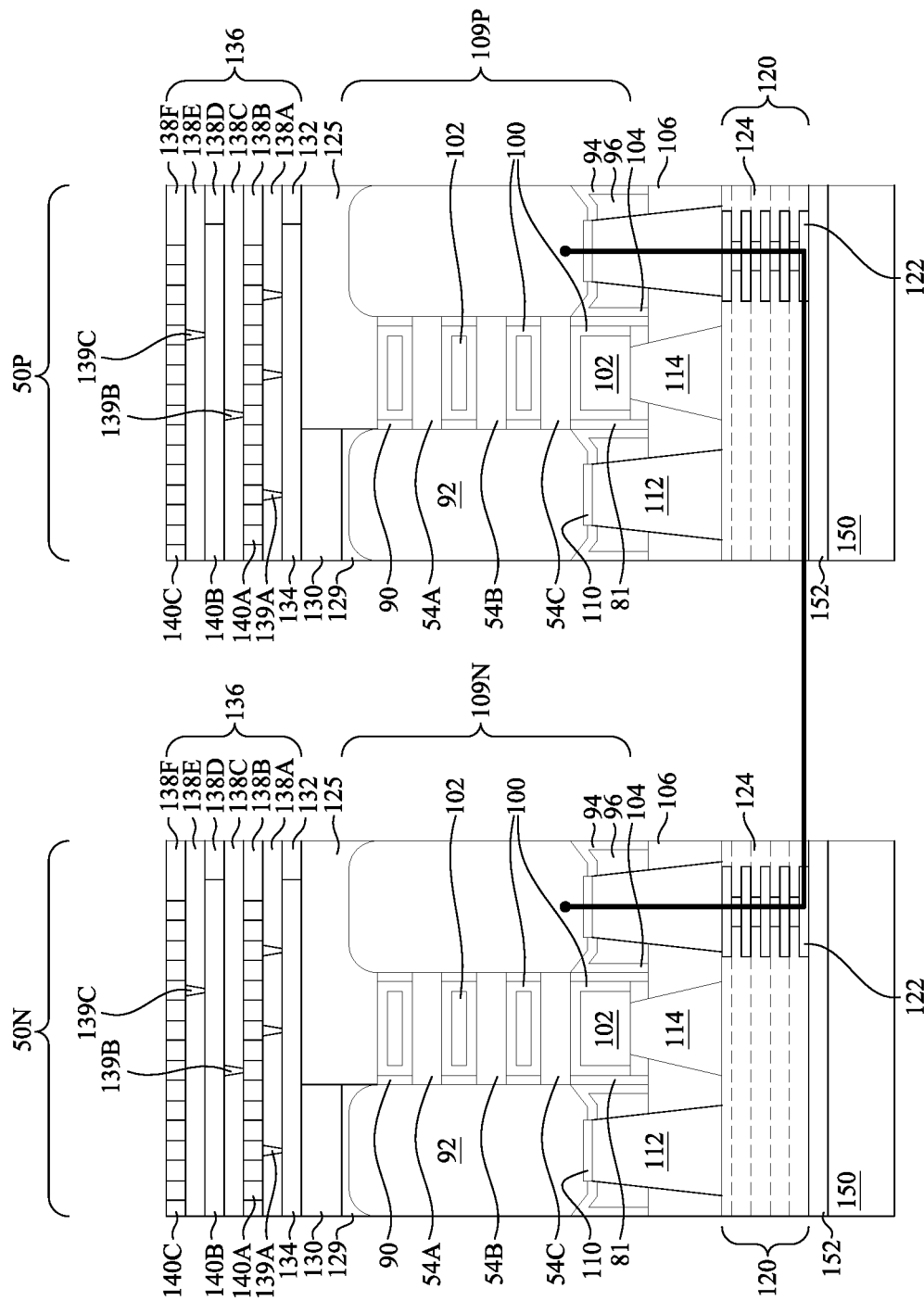

FIGS. 28H and 28I illustrate connections between an n-type nano-FET 109N and a p-type nano-FET 109P. The p-type nano-FET 109P may be electrically coupled to a power supply voltage $V_{DD}$ routed in a backside interconnect structure 136. The p-type nano-FET may be electrically coupled to the n-type nano-FET 109N through a front-side interconnect structure 120. The n-type nano-FET 109N may be electrically coupled to a power supply voltage $V_{SS}$ routed in a backside interconnect structure 136. In some embodiments, the p-type nano-FET 109P may be electrically coupled to the power supply voltage $V_{SS}$ and the n-type nano-FET 109N may be electrically coupled to the power supply voltage $V_{DD}$.

Including the decoupling capacitors 142 in the backside interconnect structure 136 between the transistor structures 109 and the power supply voltages $V_{SS}$ and $V_{DD}$ stabilizes the power supply voltages $V_{SS}$ and $V_{DD}$, which results in improved device performance. Routing the power supply voltages $V_{SS}$ and $V_{DD}$ in the backside interconnect structure 136 and providing the decoupling capacitors 142 in the backside interconnect structure 136 allows for the transistor structures 109 to be formed in a smaller area, which allows for more devices to be formed in a smaller area. Using the high-k dielectric materials 141 in the decoupling capacitors 142, which have high k-values (e.g., k-values greater than about 7.0) increases the amount of charge the decoupling capacitors 142 can hold, while allowing the size of the decoupling capacitors 142 to be minimized.

In some embodiments, decoupling capacitors may be included in the front-side interconnect structure 120 as well as the backside interconnect structure 136. In some embodiments, one or more of the first dielectric layers 124 may be formed of high-k dielectric materials. For example, a first dielectric layer 124 surrounding conductive lines in a layer of the first conductive features 122 may be formed of the high-k dielectric materials. In some embodiments, a first dielectric layer 124 between layers of the first conductive features 122 including conductive lines may be formed of the high-k dielectric materials. Forming one or more of the first dielectric layers 124 of the high-k dielectric materials allows for metal-oxide-metal decoupling capacitors to be formed in the front-side interconnect structure. Including decoupling capacitors in both the front-side interconnect structure and the backside interconnect structure allows for increased capacitance to be provided in a reduced area, which allows for more devices to be formed in a smaller area.

Figure 29B:
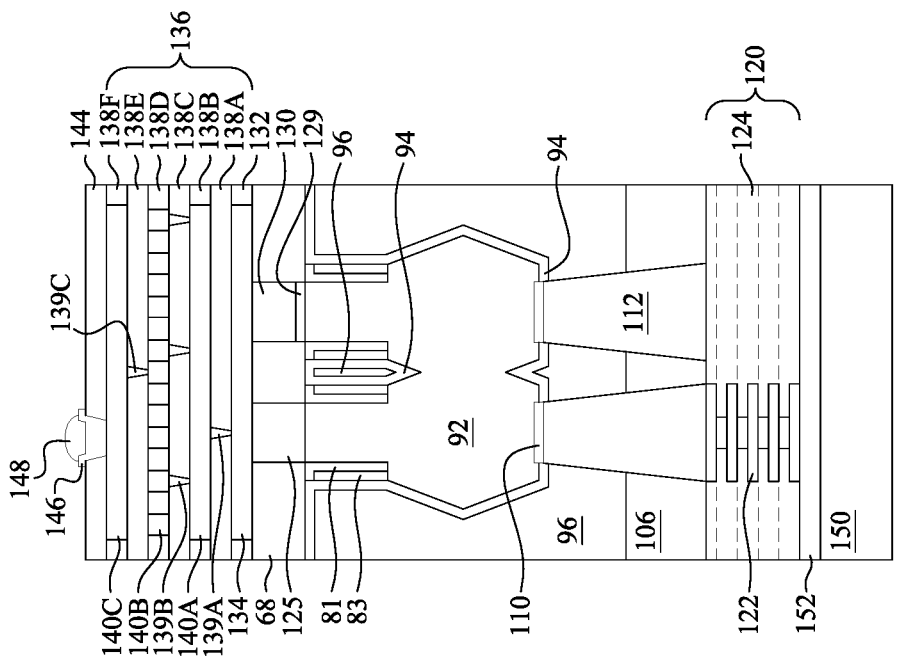
Figure 29A:
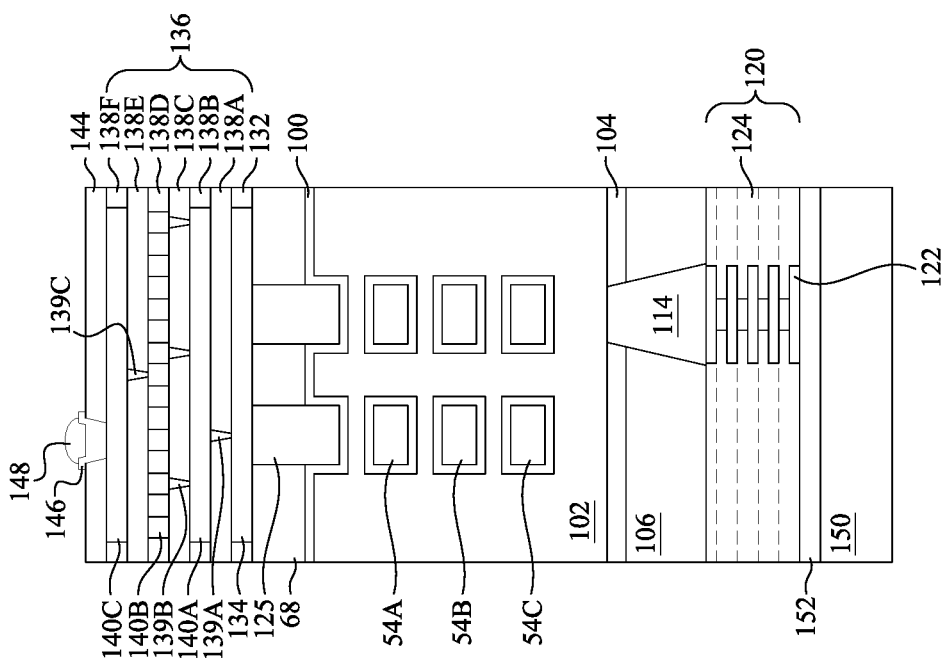
Figure 29C:
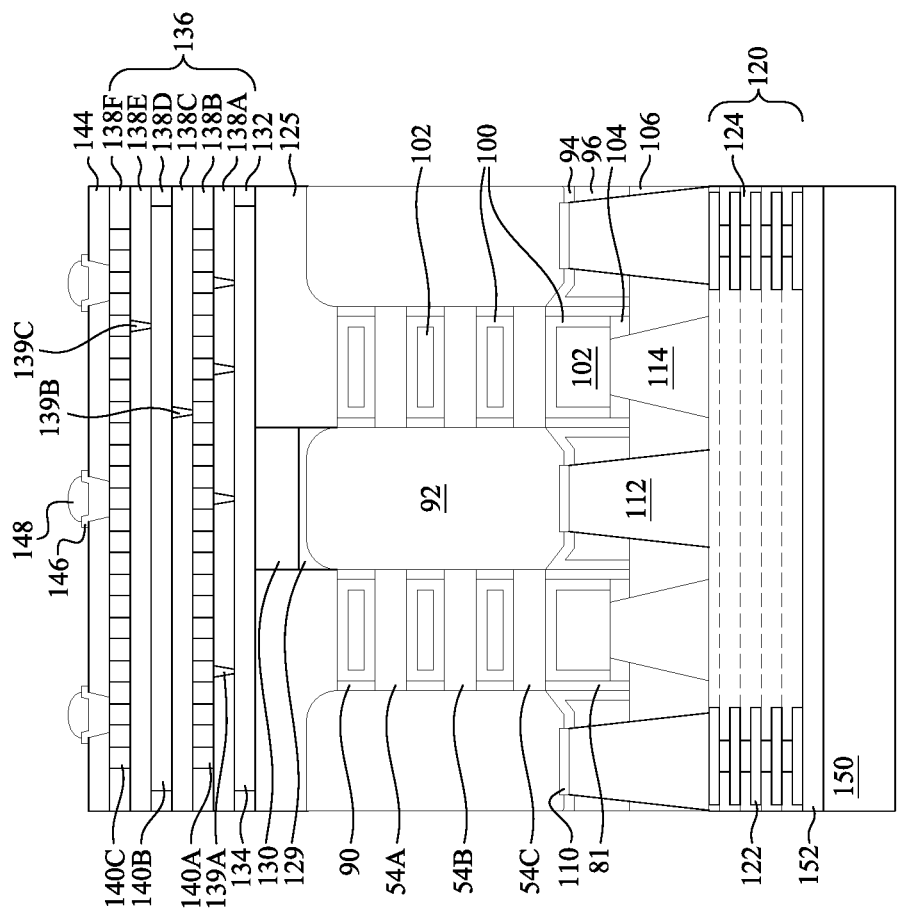

In FIGS. 29A through 29C, a passivation layer 144, UBMs 146, and external connectors 148 are formed over the backside interconnect structure 136. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 to the conductive lines 140 in the backside interconnect structure 136 and external connectors 148 are formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost conductive lines 140C and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as backside input/output pads that may provide signal, supply voltage, and/or ground connections to the nano-FETs described above.

Embodiments may achieve advantages. For example, including the decoupling capacitors 142 in the backside interconnect structures 136 stabilizes the power supply voltage VDD and the power supply voltage $V_{SS}$, which improves device performance. Moreover, including the decoupling capacitors 142, the power supply voltage $V_{DD}$ and/or the power supply voltage $V_{SS}$ in the backside interconnect structure 136 allows for more devices to be formed in a smaller area, increasing device density. Using the high-k dielectric materials 141 in the decoupling capacitors 142, which have high k-values (e.g., k-values greater than about 7.0) allows for smaller decoupling capacitors 142 to be formed, while increasing the amount of charge the decoupling capacitors 142 can hold.

In accordance with an embodiment, a device includes a device layer including a first transistor; a first interconnect structure on a front-side of the device layer; and a second interconnect structure on a backside of the device layer, the second interconnect structure including a first dielectric layer on the backside of the device layer; a contact extending through the first dielectric layer to a source/drain region of the first transistor; a first conductive layer including a first conductive line electrically connected to the source/drain region of the first transistor through the contact; and a second dielectric layer adjacent the first conductive line, the second dielectric layer including a material having a k-value greater than 7.0, a first decoupling capacitor including the first conductive line and the second dielectric layer. In an embodiment, the first conductive line is a power supply line or an electrical ground line. In an embodiment, the first conductive layer further includes a second conductive line, the first conductive line is a power supply line, the second conductive line is an electrical ground line, and the second dielectric layer is between the first conductive line and the second conductive line. In an embodiment, the second interconnect structure further includes a second conductive layer, the second conductive layer includes a second conductive line, the first conductive line is a power supply line, the second conductive line is an electrical ground line, and the second dielectric layer is between the first conductive layer and the second conductive layer in a direction perpendicular to a major surface of the device layer. In an embodiment, the second dielectric layer includes a metal oxide material. In an embodiment, the first interconnect structure includes a second decoupling capacitor. In an embodiment, the device layer includes a second transistor, the second transistor being coupled to the first transistor through the first interconnect structure.

In accordance with another embodiment, a device includes a first transistor structure and a second transistor structure in a device layer; a front-side interconnect structure on a front-side of the device layer, the first transistor being electrically coupled to the second transistor through the front-side interconnect structure; and a backside interconnect structure on a backside of the device layer, the backside interconnect structure including a first dielectric layer on the backside of the device layer; a first contact extending through the first dielectric layer to a source/drain region of the first transistor; a decoupling capacitor; a power supply line; and an electrical ground line. In an embodiment, the decoupling capacitor includes a dielectric material extending between the power supply line and the electrical ground line in a direction parallel to a major surface of the device layer. In an embodiment, the dielectric material includes a material having a k-value greater than 7.0. In an embodiment, the decoupling capacitor includes a dielectric material extending between the power supply line and the electrical ground line in a direction perpendicular to a major surface of the device layer. In an embodiment, the first transistor structure is an n-type transistor structure, the first transistor structure is electrically coupled to the electrical ground line, the second transistor structure is a p-type transistor structure, and the second transistor structure is electrically coupled to the power supply line. In an embodiment, the power supply line is electrically coupled to the first source/drain region through the first contact, the backside interconnect structure further includes a second contact extending through the first dielectric layer and electrically coupled to a second source/drain region of the second transistor structure, and the electrical ground line is electrically coupled to the second source/drain region through the second contact. In an embodiment, the first transistor structure is electrically coupled to the front-side interconnect structure through a third source/drain region, and the second transistor structure is electrically coupled to the front-side interconnect structure through a fourth source/drain region.

In accordance with yet another embodiment, a method includes forming a first transistor on a semiconductor substrate; removing the semiconductor substrate; and forming a first interconnect structure over a backside of the first transistor, forming the first interconnect structure including forming a first dielectric layer over the backside of the first transistor; forming a backside via through the first dielectric layer and electrically coupled to a source/drain region of the first transistor; forming a second dielectric layer over the backside via and the first dielectric layer, the second dielectric layer including a dielectric material having a k-value greater than 7.0; and forming a first conductive line and a second conductive line in the second dielectric layer, the first conductive line being electrically coupled to the backside via, the first conductive line further being electrically coupled to a power supply line or an electrical ground line, a decoupling capacitor including the first conductive line, the second dielectric layer, and the second conductive line. In an embodiment, the method further includes forming a second interconnect structure over the first transistor, the first interconnect structure being formed opposite the second interconnect structure after forming the second interconnect structure, and the second interconnect structure including a second decoupling capacitor. In an embodiment, the second interconnect structure electrically couples the first transistor to a second transistor. In an embodiment, the method further includes electrically coupling a source/drain region of the second transistor to the power supply line, the first conductive line being electrically coupled to the electrical ground line. In an embodiment, the second conductive line is electrically coupled to the power supply line or the electrical ground line. In an embodiment, the method further includes forming a third conductive line over the backside via and the first dielectric layer, the third conductive line being coupled to the power supply line or the electrical ground line, and the second dielectric layer and the first conductive line being formed over the third conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first transistor on a semiconductor substrate;
   forming a front-side interconnect structure on a front-side of the first transistor, the front-side interconnect structure comprising a gate contact physically and electrically coupled to a front-side of a gate structure of the first transistor;
   removing the semiconductor substrate to expose a backside surface of the first transistor; and
   forming a backside interconnect structure on the exposed backside surface of the first transistor, the backside interconnect structure being over a backside of the first transistor, wherein forming the backside interconnect structure comprises:
   forming a first dielectric layer over the backside of the first transistor;
   forming a backside via through the first dielectric layer, wherein the backside via is formed directly on and electrically coupled to a backside of a source/drain region of the first transistor, the backside of the source/drain region facing a direction opposite the front-side of the gate structure;
   forming a second dielectric layer over the backside via and the first dielectric layer, wherein the second dielectric layer comprises a dielectric material having a k-value greater than 7.0; and
   forming a first conductive line and a second conductive line in the second dielectric layer, the first conductive line being electrically coupled to the backside via, the first conductive line further being electrically coupled to a power supply line or an electrical ground line, wherein a decoupling capacitor comprises the first conductive line, the second dielectric layer, and the second conductive line.

2. The method of claim 1, wherein the backside interconnect structure is formed after forming the front-side interconnect structure, and wherein the front-side interconnect structure further comprises a second decoupling capacitor.

3. The method of claim 2, wherein the front-side interconnect structure electrically couples the first transistor to a second transistor.

4. The method of claim 3, further comprising electrically coupling a second source/drain region of the second transistor to the power supply line, wherein the first conductive line is electrically coupled to the electrical ground line.

5. The method of claim 1, wherein the second conductive line is electrically coupled to the power supply line or the electrical ground line.

6. The method of claim 1, further comprising forming a third conductive line over the backside via and the first dielectric layer, wherein the third conductive line is coupled to the power supply line or the electrical ground line, and wherein the second dielectric layer and the first conductive line are formed over the third conductive line.

7. The method of claim 1, wherein removing the semiconductor substrate comprises thinning the semiconductor substrate to expose an epitaxial material, wherein forming the backside via comprises removing the epitaxial material to form a first recess and forming the backside via in the first recess.

8. A method comprising:
forming a first transistor comprising a first source/drain region and a second source/drain region on a substrate;
forming a first interconnect structure on a front-side of the first transistor, the first interconnect structure comprising a first source/drain contact physically and electrically coupled to a front-side of the first source/drain region; and
forming a second interconnect structure on a backside of the first transistor, wherein forming the second interconnect structure comprises:
etching the substrate to form a first recess;
forming a first dielectric layer in the first recess;
removing an epitaxial material adjacent the first dielectric layer to form a second recess exposing a backside of the second source/drain region;
forming a second source/drain contact on the second source/drain region in the second recess;
forming a second dielectric layer on the first dielectric layer and the second source/drain contact the second dielectric layer comprising a material having a k-value greater than 7.0; and
forming a first conductive layer in the second dielectric layer, the first conductive layer comprising a first conductive line electrically connected to the second source/drain region of the first transistor through the second source/drain contact, wherein a first decoupling capacitor comprises the first conductive line and the second dielectric layer.

9. The method of claim 8, wherein forming the second source/drain contact comprises:
forming a silicide in the second recess; and
forming a conductive fill material on the silicide in the second recess.

10. The method of claim 8, wherein the first conductive layer further comprises a second conductive line separated from the first conductive line by the second dielectric layer, wherein the first decoupling capacitor further comprises the second conductive line.

11. The method of claim 10, further comprising:
electrically coupling the first conductive line to a power supply line; and
electrically coupling the second conductive line to an electrical ground line, wherein the second dielectric layer is directly between and in physical contact with the first conductive line and the second conductive line.

12. The method of claim 8, wherein the second dielectric layer is formed from a metal oxide material.

13. The method of claim 8, wherein forming the first interconnect structure comprises forming a second decoupling capacitor on the front-side of the first transistor.

14. The method of claim 8, further comprising forming a second transistor comprising a third source/drain region on the substrate adjacent the first transistor, wherein the first interconnect structure further comprises a third source/drain contact physically and electrically coupled to a front-side of the third source/drain region and electrically coupled to the first source/drain contact.

15. A method comprising:
providing a first transistor structure and a second transistor structure on a substrate;
forming a front-side interconnect structure on a front-side of the first transistor structure and the second transistor structure, wherein the first transistor structure is electrically coupled to the second transistor structure through the front-side interconnect structure, wherein forming the front-side interconnect structure comprises:
forming an inter-layer dielectric layer on the first transistor structure and the second transistor structure; and
forming a gate contact extending through the inter-layer dielectric layer, wherein the gate contact is physically and electrically coupled to a front-side of a gate structure of the first transistor structure; and
removing the substrate to expose a backside of the first transistor structure and the second transistor structure;
forming a backside interconnect structure on the exposed backside of the first transistor structure and the second transistor structure, wherein forming the backside interconnect structure comprises:
forming a first dielectric layer on the backside of the first transistor structure and the second transistor structure;
forming a first contact extending through the first dielectric layer to a source/drain region of the first transistor structure, wherein the first contact is physically and electrically coupled to a backside of the source/drain region, the backside of the source/drain region facing a direction opposite the front-side of the gate structure; and
forming a decoupling capacitor on the first dielectric layer and the first contact.

16. The method of claim 15, wherein forming the front-side interconnect structure further comprises:
forming a first source/drain contact extending through the inter-layer dielectric layer, wherein the first source/drain contact is physically and electrically coupled to a front-side of a first source/drain region of the first transistor structure; and
forming a second source/drain contact extending through the inter-layer dielectric layer, wherein the second source/drain contact is physically and electrically coupled to a front-side of a second source/drain region of the second transistor structure, and wherein the second source/drain contact is electrically coupled to the first source/drain contact.

17. The method of claim 15, wherein the first transistor structure and the second transistor structure are provided on a semiconductor substrate, wherein forming the decoupling capacitor comprises:
forming a first conductive layer on the first contact and the first dielectric layer;
depositing a second dielectric layer on the first conductive layer; and
forming a second conductive layer on the second dielectric layer, wherein the second dielectric layer extends from a first conductive line in the first conductive layer to a second conductive line in the second conductive layer in a direction perpendicular to a major surface of the semiconductor substrate.

18. The method of claim 17, wherein the second dielectric layer comprises a material having a k-value greater than 7.0.

19. The method of claim 15, wherein the first transistor structure and the second transistor structure are provided on a semiconductor substrate, wherein forming the decoupling capacitor comprises:
- depositing a second dielectric layer on the first contact and the first dielectric layer; and
- forming a first conductive line and a second conductive line in the second dielectric layer, wherein the second dielectric layer extends from the first conductive line to the second conductive line a direction parallel to a major surface of the semiconductor substrate.

20. The method of claim 15, further comprising:
- electrically coupling the first transistor structure to an electrical ground line, wherein the first transistor structure is an n-type transistor structure; and
- electrically coupling the second transistor structure to a power supply line, wherein the second transistor structure is a p-type transistor structure.

* * * * *